(12) United States Patent
Godo et al.

(10) Patent No.: US 7,923,730 B2
(45) Date of Patent: Apr. 12, 2011

(54) THIN FILM TRANSISTOR AND SEMICONDUCTOR DEVICE

(75) Inventors: Hiromichi Godo, Atsugi (JP); Hidekazu Miyairi, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 35 days.

(21) Appl. No.: 12/273,027

(22) Filed: Nov. 18, 2008

(65) Prior Publication Data
US 2009/0140256 A1    Jun. 4, 2009

(30) Foreign Application Priority Data

Dec. 3, 2007    (JP) .................................. 2007-311965

(51) Int. Cl.
*H01L 29/10*    (2006.01)
(52) U.S. Cl. ................. 257/66; 257/59; 257/72; 257/88; 257/91; 257/E29.169; 257/E27.147; 257/E29.277
(58) Field of Classification Search .................... 257/59, 257/66, 72, 88, 91
See application file for complete search history.

(56) References Cited

U.S. PATENT DOCUMENTS

| | | | |
|---|---|---|---|
| 4,409,134 A | 10/1983 | Yamazaki | |
| 5,453,858 A | 9/1995 | Yamazaki | |
| 5,514,879 A | 5/1996 | Yamazaki | |
| 5,614,732 A | 3/1997 | Yamazaki | |
| 5,701,167 A | 12/1997 | Yamazaki | |
| 5,726,461 A * | 3/1998 | Shimada et al. | 257/59 |
| 5,849,601 A | 12/1998 | Yamazaki | |
| 5,859,445 A | 1/1999 | Yamazaki | |
| 6,011,277 A | 1/2000 | Yamazaki | |
| 6,023,075 A | 2/2000 | Yamazaki | |
| 6,252,249 B1 | 6/2001 | Yamazaki | |
| 6,281,520 B1 | 8/2001 | Yamazaki | |
| 6,306,213 B1 | 10/2001 | Yamazaki | |
| 6,737,676 B2 | 5/2004 | Yamazaki | |

(Continued)

FOREIGN PATENT DOCUMENTS

JP    58-092217    6/1983

(Continued)

OTHER PUBLICATIONS

Kim et al., "Depletion-mode a-Si:H TFT and its application to AMOLED," AM-FPD '08 Digest of Technical Papers, Jul. 2, 2008, pp. 279-282, the Japan Society of Applied Physics.

*Primary Examiner* — Ahmed Sefer
(74) *Attorney, Agent, or Firm* — Eric J. Robinson; Robinson Intellectual Property Law Office, P.C.

(57) ABSTRACT

An impurity element imparting one conductivity type is included in a layer close to a gate insulating film of layers with high crystallinity, so that a channel formation region is formed not in a layer with low crystallinity which is formed at the beginning of film formation but in a layer with high crystallinity which is formed later in a microcrystalline semiconductor film. Further, the layer including an impurity element is used as a channel formation region. Furthermore, a layer which does not include an impurity element imparting one conductivity type or a layer which has an impurity element imparting one conductivity type at an extremely lower concentration than other layers, is provided between a pair of semiconductor films including an impurity element functioning as a source region and a drain region and the layer including an impurity element functioning as a channel formation region.

22 Claims, 17 Drawing Sheets

| U.S. PATENT DOCUMENTS | | | |
|---|---|---|---|
| 7,067,844 B2 | 6/2006 | Yamazaki | |
| 7,098,479 B1 | 8/2006 | Yamazaki | |
| 7,115,902 B1 | 10/2006 | Yamazaki | |
| 7,205,171 B2 | 4/2007 | Luo et al. | |
| 7,375,372 B2 | 5/2008 | Luo et al. | |
| 2007/0018165 A1 | 1/2007 | Yamazaki | |
| 2008/0224139 A1* | 9/2008 | Lai et al. | 257/57 |
| 2009/0057672 A1* | 3/2009 | Kobayashi et al. | 257/59 |
| 2009/0090915 A1* | 4/2009 | Yamazaki et al. | 257/66 |
| 2009/0090916 A1* | 4/2009 | Yamazaki et al. | 257/66 |
| 2009/0140259 A1* | 6/2009 | Yamazaki | 257/67 |
| 2009/0218568 A1* | 9/2009 | Dairiki et al. | 257/57 |

| FOREIGN PATENT DOCUMENTS | | | |
|---|---|---|---|
| JP | 60-160170 | | 8/1985 |
| JP | 62-067872 | | 3/1987 |
| JP | 63-258072 | | 10/1988 |
| JP | 2-1174 | * | 1/1990 |
| JP | 04-242724 | | 8/1992 |
| JP | 5-226656 | * | 5/1993 |
| JP | 06-326312 | | 11/1994 |
| JP | 11-121761 | | 4/1999 |
| JP | 11-121761 | * | 11/1999 |
| JP | 2005-049832 | | 2/2005 |

* cited by examiner

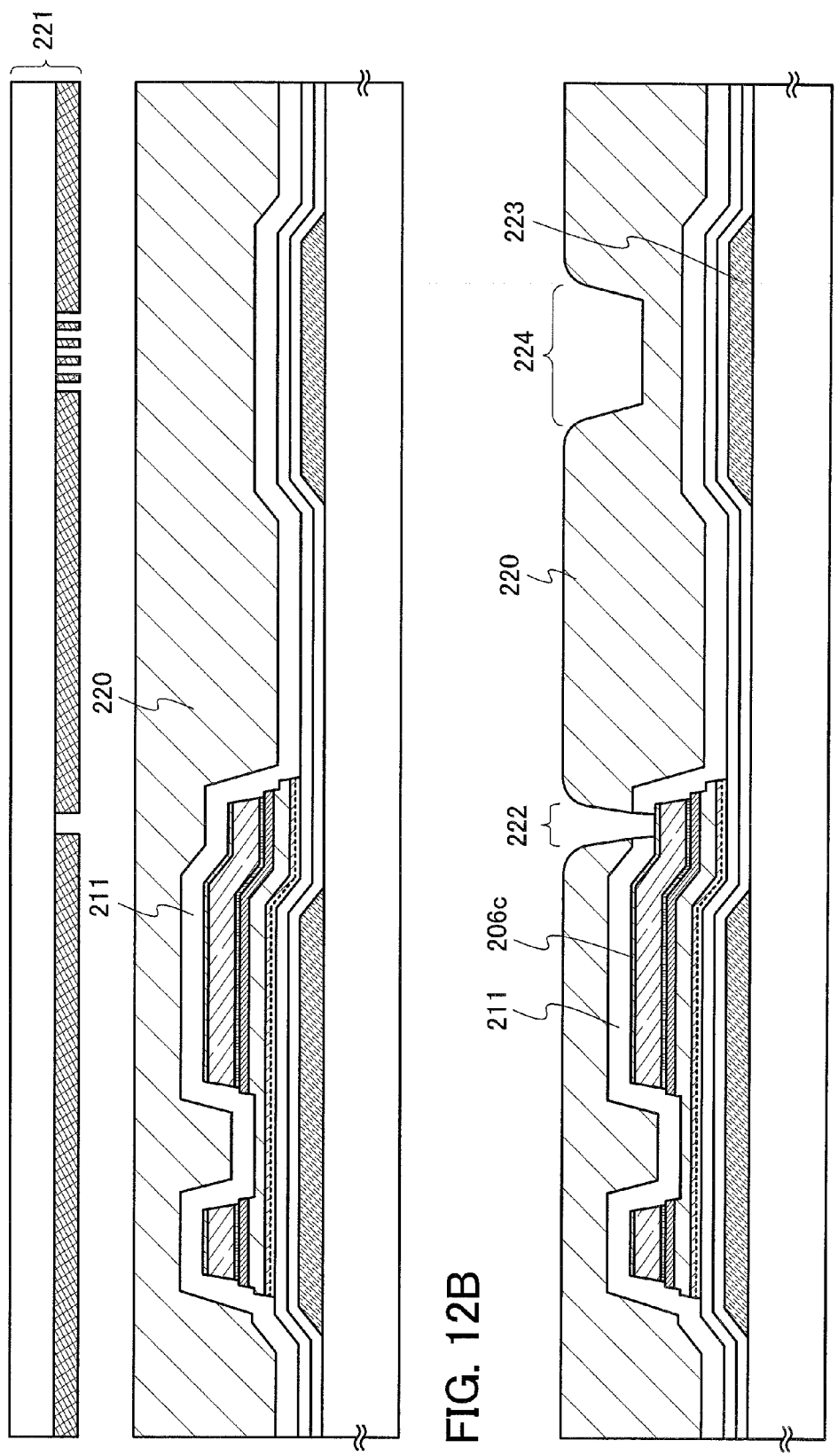

THIN FILM TRANSISTOR AND SEMICONDUCTOR DEVICE

BACKGROUND OF THE INVENTION

1. Field of the Invention

The present invention relates to a thin film transistor and a semiconductor device using the thin film transistor.

2. Description of the Related Art

A thin film transistor (TFT) can be formed over an inexpensive glass substrate, and can be widely used as a semiconductor element included in an active matrix semiconductor display device. TFT characteristics such as mobility or ON current are determined depending on the crystallinity of a semiconductor film used for a TFT. For example, a mobility of a TFT with a channel formation region formed of an amorphous semiconductor film is about from 0.4 $cm^2$/V·sec to 0.8 $cm^2$/V·sec, while a mobility of a TFT with a channel formation region formed of a polycrystalline semiconductor film is about from several tens of $cm^2$/V·sec to several hundreds of $cm^2$/V·sec. Therefore, the mobility of a TFT using a polycrystalline semiconductor film is two or more digits higher than a TFT using an amorphous semiconductor film, and thus, high ON current is obtained.

However, a grain diameter of a crystal grain included in a polycrystalline semiconductor film ranges from several micrometers to several hundreds of micrometers. Accordingly, a TFT using a polycrystalline semiconductor film has a disadvantage in that variation in mobility and ON current between elements is large because of nonuniform crystallinity in channel formation regions between the elements, though the TFT using a polycrystalline semiconductor film has an advantage in that mobility and ON current are higher than those of a TFT using an amorphous semiconductor film. Consequently, when a polycrystalline semiconductor film is used for a TFT with emphasis on high mobility, variation occurs between elements. In contrast, when an amorphous semiconductor film is used for a TFT with emphasis on the uniformity of mobility between elements, it is difficult to ensure high mobility.

Therefore, a TFT in which a microcrystalline semiconductor film having a crystal grain of about from several nanometers to several hundreds of nanometers is used for a channel formation region has been developed. With the use of TFTs using a microcrystalline semiconductor film, variation in mobility and ON current between elements can be prevented while it is ensured that mobility and ON current are high to some extent.

In Reference 1 (Japanese Published Patent Application No. H4-242724) and Reference 2 (Japanese Published Patent Application No. 2005-49832), a semiconductor display device using a thin film transistor having a microcrystalline semiconductor film as a switching element is described.

SUMMARY OF THE INVENTION

The microcrystalline semiconductor film is generally formed by a vapor phase growth method such as a CVD method. A layer which is formed at the beginning of the film formation is a layer of amorphous or a layer with plenty of crystal defects; thus, the crystallinity of the layer is extremely low as compared to a layer which is formed later. Therefore, in the case of an inverted staggered TFT which is obtained by forming a gate electrode, a gate insulating film, and a microcrystalline semiconductor film in this order, crystallinity is reduced at the vicinity of the interface between the microcrystalline semiconductor film and the gate insulating film. Therefore, an inverted staggered TFT using a microcrystalline semiconductor film has a problem in that it is difficult to enhance TFT characteristics such as mobility and ON current because a channel formation region where majority carriers move is formed at the vicinity of the interface with low crystallinity as described above.

In view of the foregoing problem, it is an object of the present invention to provide a thin film transistor using a microcrystalline semiconductor film with which higher mobility and ON current can be obtained, and to provide a semiconductor device using the thin film transistor.

According to one structure of the present invention, an impurity element imparting one conductivity type is included in a layer close to a gate insulating film of layers with high crystallinity, so that a channel formation region is formed not in a layer with low crystallinity which is formed at the beginning of film formation but in a layer with high crystallinity which is formed later in a microcrystalline semiconductor film. Further, the layer including an impurity element is used as a channel formation region. Furthermore, a layer which does not include the impurity element imparting one conductivity type or a layer which has the impurity element imparting one conductivity type at an extremely lower concentration than other layers, is provided between a pair of semiconductor films including an impurity element which functions as a source region and a drain region and the layer including the impurity element which functions as a channel formation region.

As the impurity element which is included in the layer close to the gate insulating film of layers with high crystallinity, an impurity element imparting n-type conductivity type is used in the case of an n-type thin film transistor, and an impurity element imparting p-type conductivity type is used in the case of an p-type thin film transistor.

Specifically, one aspect of a thin film transistor included in a semiconductor device of the present invention is to include a conductive film on an insulating surface; a gate insulating film over the conductive film; a first semiconductor film which overlaps with the conductive film over the gate insulating film; and a pair of second semiconductor films over the first semiconductor film. In the thin film transistor, the first semiconductor film includes a microcrystalline semiconductor, and has a layer which is separated from the gate insulating film and the pair of second semiconductor films and which includes an impurity element.

Specifically, another aspect of a thin film transistor included in a semiconductor device of the present invention is to include a conductive film on an insulating surface; a gate insulating film over the conductive film; a first semiconductor film which overlaps with the conductive film over the gate insulating film; and a pair of second semiconductor films over the first semiconductor film. In the thin film transistor, the first semiconductor film has at least a semiconductor film including a microcrystalline semiconductor on the gate insulating film side and a semiconductor film including an amorphous semiconductor on a side of the pair of second semiconductor films. In addition, the semiconductor film including a microcrystalline semiconductor is separated from the gate insulating film and has a layer including an impurity element.

In a thin film transistor of the present invention, a layer with higher crystallinity in a microcrystalline semiconductor film can be used as a channel formation region; accordingly, ON current and mobility can be improved. Further, by using a thin film transistor of the present invention, a semiconductor device which drives at higher speed or a semiconductor device with higher performance can be manufactured.

BRIEF DESCRIPTION OF THE DRAWINGS

In the accompanying drawings:

FIGS. 12A and 12B are diagrams illustrating a method for manufacturing a semiconductor device including a thin film transistor of the present invention;

DETAILED DESCRIPTION OF THE INVENTION

Embodiment Mode

Hereinafter, embodiment modes of the present invention will be described with reference to the drawings. However, the present invention can be implemented in many different modes and it is easily understood by those skilled in the art that the mode and detail can be variously changed without departing from the scope and spirit of the present invention. Therefore, the present invention should not be interpreted as being limited to the description of embodiment modes.

Embodiment Mode 1

Figure 1A:
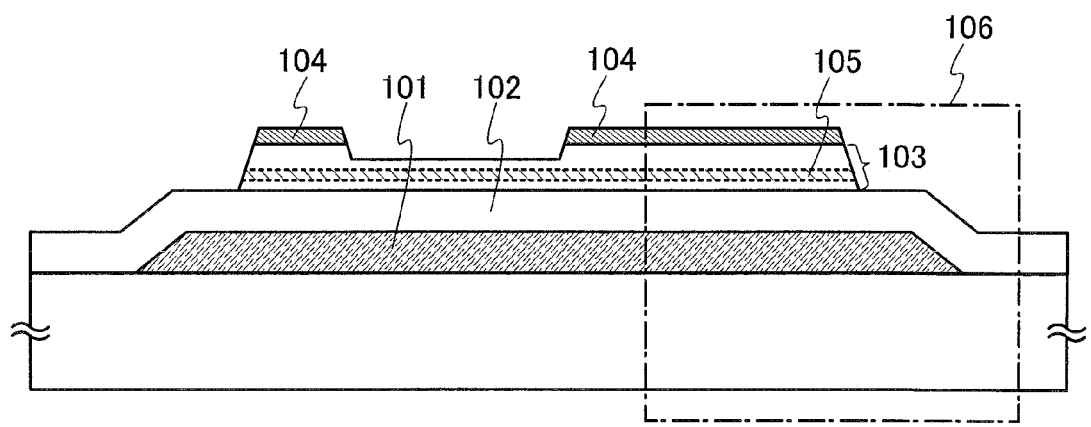
FIGS. 1A to 1C are cross-sectional views of a thin film transistor of the present invention.

A structure of a thin film transistor of the present invention is described with reference to FIGS. 1A to 1C. FIG. 1A shows a cross-sectional view of a thin film transistor of the present invention as an example. In FIG. 1A, a conductive film 101 functioning as a gate electrode is formed over a substrate having an insulating surface, such as a glass substrate, and a gate insulating film 102 is formed to cover the conductive film 101. A semiconductor film 103 is formed over the gate insulating film 102 to overlap with the conductive film 101 with the gate insulating film 102 interposed therebetween. It is acceptable as long as at least part of the semiconductor film 103 overlaps with the conductive film 101.

Further, a pair of semiconductor films 104 is formed over the semiconductor film 103. The pair of semiconductor films 104, which includes an impurity element imparting one conductivity type, functions as a source region and a drain region. In FIG. 1A, as the impurity element, an impurity element imparting n-type conductivity can be used. For example, an element belonging to Group 15 such as phosphorus (P), arsenic (As), or antimony (Sb); an element belonging to Group 16 such as sulfur (S), tellurium (Te), or selenium (Se); or the like which functions as a donor can be used.

Note that the pair of semiconductor films 104 may include an impurity element which imparts p-type conductivity. In this case, an element belonging to Group 13 such as boron (B), aluminum (Al), gallium (Ga), or indium (In); an element belonging to Group 12 such as zinc (Zn); or the like which functions as an acceptor can be used as the impurity element.

In the present invention, the semiconductor film 103 includes a microcrystalline semiconductor of silicon, germanium, or the like. A crystal grain diameter of a microcrystalline semiconductor is 0.5 nm to 100 nm, preferably 1 nm to 20 nm. An amorphous semiconductor may be included in part of a microcrystalline semiconductor.

Note that a microcrystalline semiconductor is a semiconductor having an intermediate structure between amorphous and crystalline structures (including single crystal and polycrystal). This semiconductor is in a third state which is stable in free energy, and is a crystalline semiconductor having short-range order and lattice distortion, and columnar or needle-like crystals with a grain diameter of from 0.5 nm to 100 nm, preferably from 1 nm to 20 nm have grown in a direction of the normal to the surface of the substrate. Further, an amorphous semiconductor is present between a plurality of microcrystalline semiconductors. A Raman spectrum of microcrystalline silicon, which is a typical example of a microcrystalline semiconductor, is located in the lower wavenumber side than 520 $cm^{-1}$, which represents single crystal silicon. That is to say, a peak of a Raman spectrum of microcrystalline silicon lies between 520 $cm^{-1}$ and 480 $cm^{-1}$, which represent single crystal silicon and amorphous silicon, respectively. Furthermore, the microcrystalline semiconductor includes hydrogen or a halogen at 1 at. % or more in order to terminate a dangling bond. The microcrystalline semiconductor may further include a noble gas such as helium, argon, krypton, neon, or xenon to further promote lattice distortion, so that the stability is enhanced and a favorable microcrystalline semiconductor can be obtained.

The semiconductor film 103 can be formed by a CVD method or the like. In the case of using a CVD method, in addition to a deposition gas including silicon or germanium, hydrogen is also introduced into a reaction chamber of a plasma CVD apparatus, and plasma is generated by application of high-frequency power, whereby the semiconductor film 103 including a microcrystalline semiconductor can be formed over the gate insulating film 102.

Further, a deposition gas including silicon or germanium, which is silane here; hydrogen; and/or a noble gas are introduced and mixed in a reaction chamber, and glow discharge plasma is generated by application of high-frequency power, thereby forming the semiconductor film 103 including a microcrystalline semiconductor. Silane is diluted 10- to 2000-fold with hydrogen and/or a noble gas. Therefore, a large amount of hydrogen and/or a noble gas is needed. The substrate heating temperature is 100° C. to 300° C., preferably 120° C. to 220° C. It is preferable that the film be formed at a temperature of 100° C. to 400° C., more preferably 150° C. to 300° C., so that a growing surface of the semiconductor film 103 is inactivated with hydrogen and growth of microcrystalline silicon is promoted.

In the step for forming the semiconductor film 103, glow discharge plasma is generated by applying high-frequency power with a frequency of 1 MHz to 20 MHz, typically 13.56 MHz, or high-frequency power with a frequency in the VHF band of 20 MHz to approximately 120 MHz excluding 20 MHz, typically 27.12 MHz or 60 MHz.

In the present invention, an impurity element imparting one conductivity type is added to a semiconductor layer 105, which is part of the semiconductor film 103. In order to clearly show a structure of the semiconductor film 103, an enlarged view of a portion surrounded by a dashed line 106 in FIG. 1A is shown in FIG. 1B. An impurity element which is added to the semiconductor layer 105 is an impurity element imparting the same conductivity type as an impurity element included in the pair of semiconductor films 104. For example, as an impurity element imparting n-type conductivity, an element belonging to Group 15 such as phosphorus (P), arsenic (As), or antimony (Sb); an element belonging to Group 16 such as sulfur (S), tellurium (Te), or selenium (Se); or the like which functions as a donor can be used. Alternatively, as an impurity element imparting p-type conductivity, an element belonging to Group 13 such as boron (B), aluminum (Al), gallium (Ga), or indium (In); an element belonging to Group 12 such as zinc (Zn); or the like which functions as an acceptor can be used.

Note that the semiconductor layer 105 is provided in a position separated from the gate insulating film 102 and the pair of semiconductor films 104. That is, an I layer of the semiconductor film 103 which does not include an impurity element or includes an impurity element at an extremely low concentration which is lower than the detection limit of secondary ion mass spectrometry (SIMS) is present between the semiconductor layer 105 and the gate insulating film 102. Further, an I layer of the semiconductor film 103 which does not include an impurity element or includes an impurity element at an extremely low concentration which is lower than the detection limit of SIMS is also present between the semiconductor layer 105 and the pair of semiconductor films 104.

By adding an impurity element to the semiconductor layer 105, the resistivity of the semiconductor layer 105 can be made lower than that of the I layer of the semiconductor film 103 which is present between the semiconductor layer 105 and the gate insulating film 102. In the I layer of the semiconductor film 103 which is present between the semiconductor layer 105 and the gate insulating film 102, a layer 107 with low crystallinity which is formed at the beginning of formation of the semiconductor film 103 is included. The resistivity of the semiconductor layer 105 is made lower than that of the I layer of the semiconductor film 103 which is present between the semiconductor layer 105 and the gate insulating film 102, whereby majority carriers can be preferentially moved in the semiconductor layer 105, that is, the semiconductor layer 105 with higher crystallinity can be made to function as a channel formation region. Accordingly, mobility and ON current of a transistor can be increased. In addition, by separating the semiconductor layer 105 from the gate insulating film 102 and the pair of semiconductor films 104, OFF current that flows between the pair of semiconductor films 104 in turning off a transistor can be suppressed.

Figure 3A:
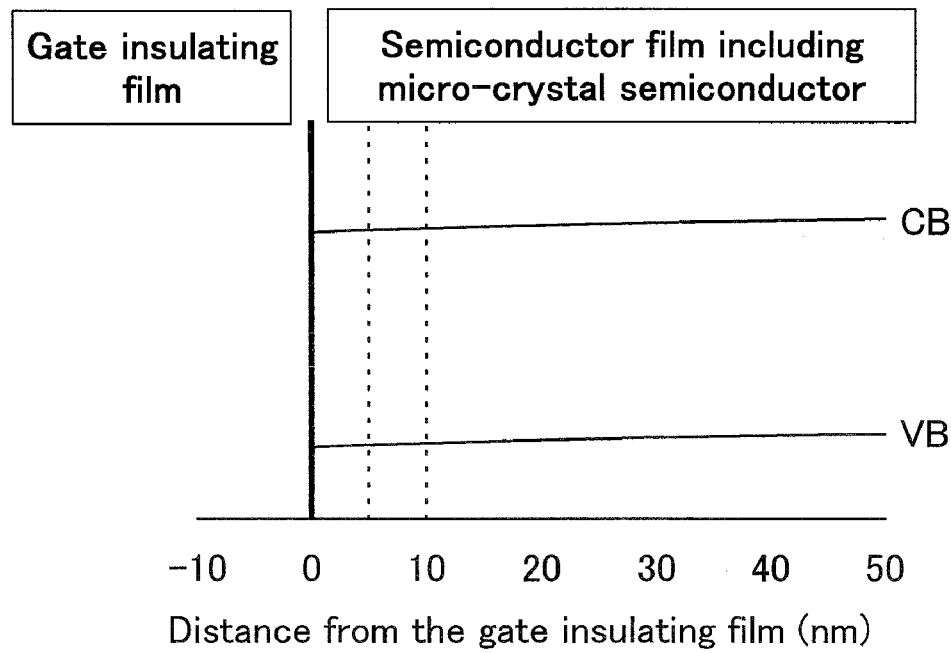
FIGS. 3A and 3B are diagrams illustrating band structures of semiconductor films including a microcrystalline semiconductor.
Figure 3B:
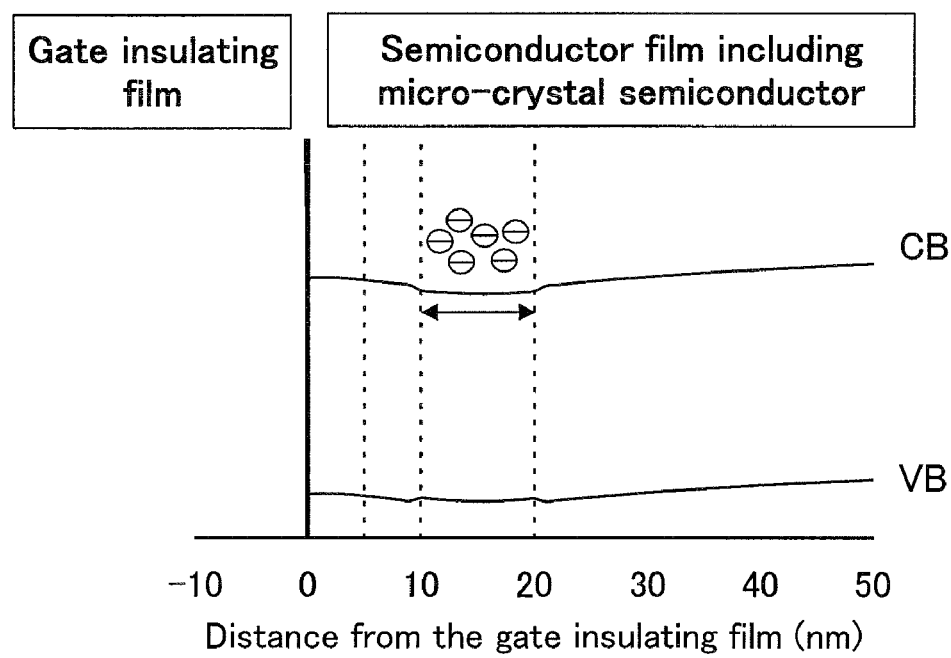

FIGS. 3A and 3B each show a band structure of the semiconductor film including a microcrystalline semiconductor. In FIGS. 3A and 3B, a vertical axis represents electron energy (eV) and a horizontal axis represents a distance (nm) from the interface between the semiconductor film and the gate insulating film in the semiconductor film. FIG. 3A shows a band structure of the semiconductor film of the case where an impurity element as a dopant is not added intentionally. FIG. 3B shows a band structure of the semiconductor film of the case where an impurity element imparting n-type conductivity is included as a dopant in a layer at a distance of from 10 nm to 20 nm from the interface between the semiconductor film and the gate insulating film.

FIG. 3B shows that, as compared to FIG. 3A, both an energy level of a conduction band (CB) and an energy level of a valence band (VB) are lowered in the layer at the distance of from 10 nm to 20 nm which includes a dopant, so that a channel is formed therein.

Figure 4A:
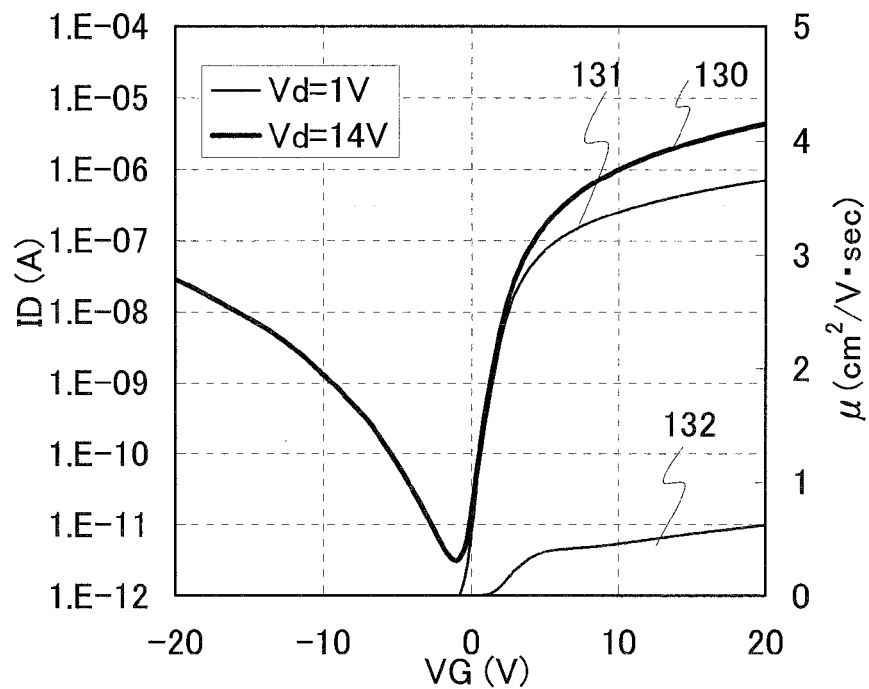
FIGS. 4A and 4B are graphs showing a relation between gate voltage VG, current ID, and mobility μ of an inverted staggered thin film transistor which is obtained from calculation.
Figure 4B:
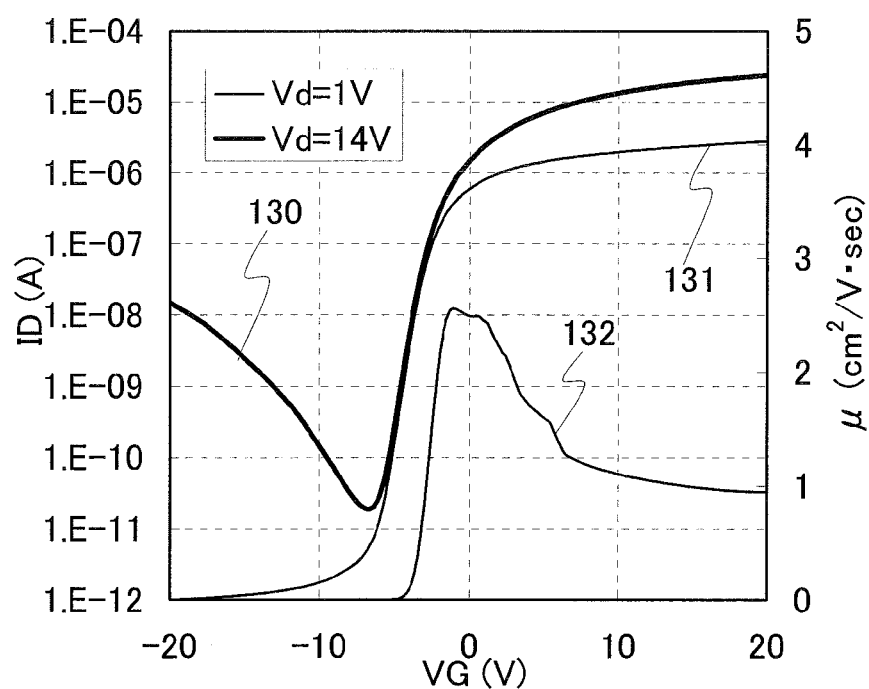

FIGS. 4A and 4B each show a relation between voltage between a gate electrode and a source region (gate voltage VG), current ID (A) between the source region and a drain region, and mobility μ ($cm^2/V \cdot sec$) of an inverted staggered thin film transistor. The gate voltage, the current ID, and the mobility μ are obtained by calculation. The semiconductor film 103 including a microcrystalline semiconductor is used in the thin film transistor, and it is assumed that the thin film transistor has a channel length of 6 μm, a channel width of 15 μm, the gate insulating film 102 formed of a silicon nitride film with a relative dielectric constant of 7.5 and with a thickness of 200 nm, and the conductive film 101 as a gate electrode which is formed using molybdenum (Mo). In addition, it is assumed that the layer 107 with low crystallinity, that is, a layer including an amorphous semiconductor is present in the layer at a distance of from 0 nm to 5 nm from the interface between the gate insulating film 102 and the semiconductor film 103.

In FIG. 4A, it is assumed that a general thin film transistor which does not include a dopant in the semiconductor film 103 is used. In FIG. 4B, it is assumed that a thin film transistor which includes as a dopant an impurity element imparting n-type conductivity at a concentration of $1 \times 10^{18}$ atoms/cm$^3$ in the layer at a distance of from 10 nm to 20 nm from the interface between the semiconductor film 103 and the gate insulating film 102 is used.

In FIGS. 4A and 4B, a solid line 130 is a graph representing a value of current ID in the case where a voltage between the source region and the drain region is 14 V; a solid line 131 is a graph representing a value of current ID in the case where a voltage between the source region and the drain region is 1 V; and a solid line 132 is a graph representing a value of mobility t. A value of current ID in FIG. 4B is approximately one digit larger than that in FIG. 4A, and a mobility t in FIG. 4B is also higher than that in FIG. 4A.

Note that although FIG. 4B shows a state of normally on in which current ID is high even in the case where a gate voltage VG is 0 V, a state of normally off can be obtained by increasing a work function of the conductive film 101 used as a gate electrode.

Note that the peak concentration of an impurity element which is added to the semiconductor layer 105 is higher than or equal to $1 \times 10^{17}$ atoms/cm$^3$ and lower than or equal to $1 \times 10^{21}$ atoms/cm$^3$, preferably higher than or equal to $1 \times 10^{17}$ atoms/cm$^3$ and lower than or equal to $1 \times 10^{20}$ atoms/cm$^3$, more preferably higher than or equal to $1 \times 10^{17}$ atoms/cm$^3$ and lower than or equal to $1 \times 10^{19}$ atoms/cm$^3$. Further, the concentration of an impurity element is determined by the peak concentration of a concentration distribution (concentration profile) which is measured by secondary ion mass spectrometry.

Further, it is preferable that a distance from the interface between the gate insulating film 102 and the semiconductor film to the semiconductor layer 105 be, for example, from 3 nm to 20 nm, more preferably from 10 nm to 15 nm, though it depends on a thickness of the layer 107 with low crystallinity which is included in the semiconductor film 103. Note that in the semiconductor film 103, the semiconductor layer 105 may be present in whole of a layer at a predetermined distance from the interface between the gate insulating film 102 and the semiconductor film 103 or may be present in part of the layer at the predetermined distance. For example, the semiconductor layer 105 may be present in a region of the layer at the predetermined distance which does not overlap with the pair of semiconductor films 104. In addition, the thickness of the semiconductor layer 105 in a depth direction of the semiconductor film 103 may be preferably about 5 nm to 20 nm, more preferably about 10 nm to 15 nm.

Figure 1B:
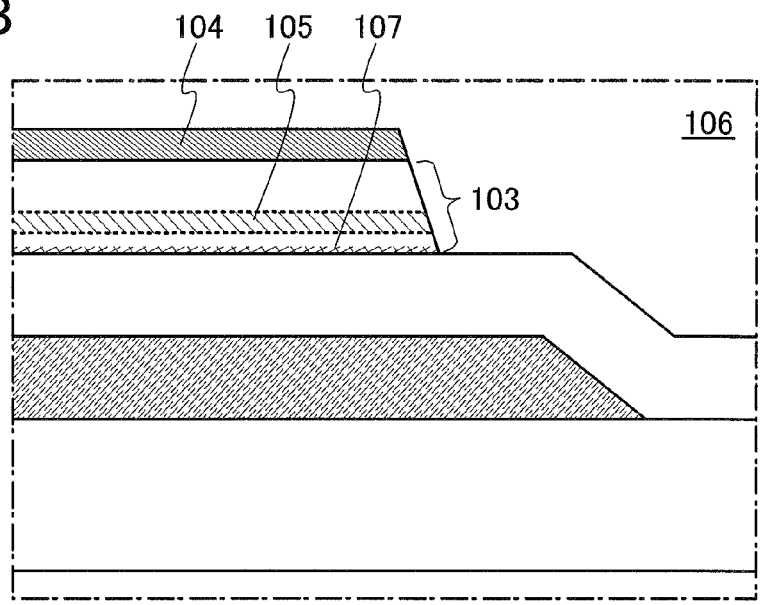
Figure 1C:
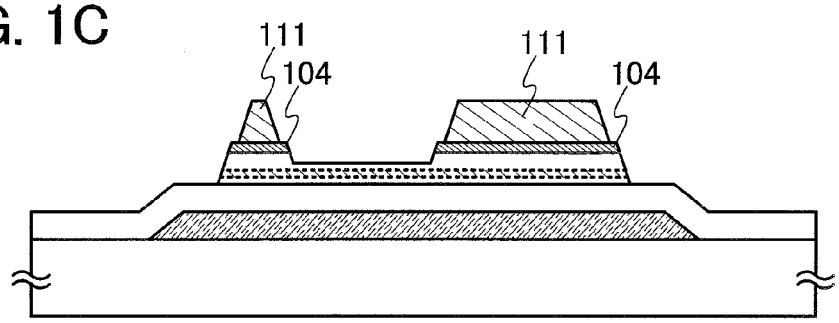

FIG. 1C is a cross-sectional view of a thin film transistor of the present invention in which conductive films 111 are formed in contact with the pair of semiconductor films 104. In order to suppress OFF current that flows between the pair of semiconductor films 104 when the thin film transistor is off, the conductive films 111 are preferably formed in a position which is not in contact with the semiconductor layer 105 exposed in a cross section of the semiconductor film 103, that is, in a position separated from the semiconductor layer 105. In this embodiment mode, whole of the conductive films 111 is completely formed over the pair of semiconductor films 104; therefore, insulation between the semiconductor layer 105 and the conductive films 111 can be ensured.

Figure 2A:
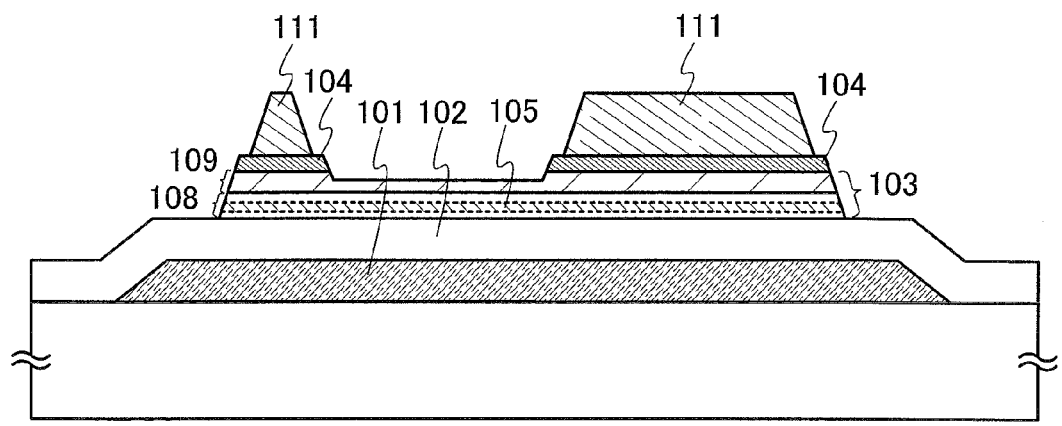
FIGS. 2A to 2C are cross-sectional views of thin film transistors of the present invention.

FIG. 2A shows an example of a cross-sectional view of a thin film transistor of the present invention which has a mode different from modes of FIGS. 1A to 1C. In a thin film transistor shown in FIG. 2A, a semiconductor film 103 has a first semiconductor layer 108 including a microcrystalline semiconductor and a second semiconductor layer 109 including an amorphous semiconductor. The first semiconductor layer 108 is provided on the gate insulating film 102 side, and the second semiconductor layer 109 is provided on the pair of semiconductor films 104 side. Further, an impurity element imparting one conductivity type is added to a semiconductor layer 105 which is in part of the first semiconductor layer 108 including a microcrystalline semiconductor. By providing the second semiconductor layer including an amorphous semiconductor between the semiconductor layer 105 and the pair of semiconductor films 104, OFF current that flows between the pair of semiconductor films 104 in turning off the transistor can be further suppressed as compared to the thin film transistor of FIGS. 1A to 1C.

The first semiconductor layer 108 and the second semiconductor layer 109 may each include a microcrystalline semiconductor and an amorphous semiconductor. Note that the first semiconductor layer 108 includes more microcrystalline semiconductor than the second semiconductor layer 109. In order to reduce OFF current, at least a back channel is preferably made of an amorphous semiconductor Here, the back channel is part of the second semiconductor 109 that the pair of semiconductor film 104 does not contact.

FIG. 2A shows a structure in which the semiconductor film 103 only has the second semiconductor layer 109 including an amorphous semiconductor, along with the first semiconductor layer 108 including a microcrystalline semiconductor. However, the present invention is not limited to this structure. In the present invention, it is acceptable as long as the semiconductor film 103 has at least the first semiconductor layer 108 including a microcrystalline semiconductor on the gate insulating film 102 side. Therefore, the semiconductor film 103 may have a plurality of semiconductor layers which differ from each other in crystallinity or may have a plurality of semiconductor layers which differ from each other in concentration of an impurity element, between the first semiconductor layer 108 and the pair of semiconductor films 104. However, at least one semiconductor layer which does not include an impurity element or includes an impurity element at an extremely lower concentration than the detection limit of SIMS is provided between the semiconductor layer 105 and the pair of semiconductor films 104.

Figure 2B:
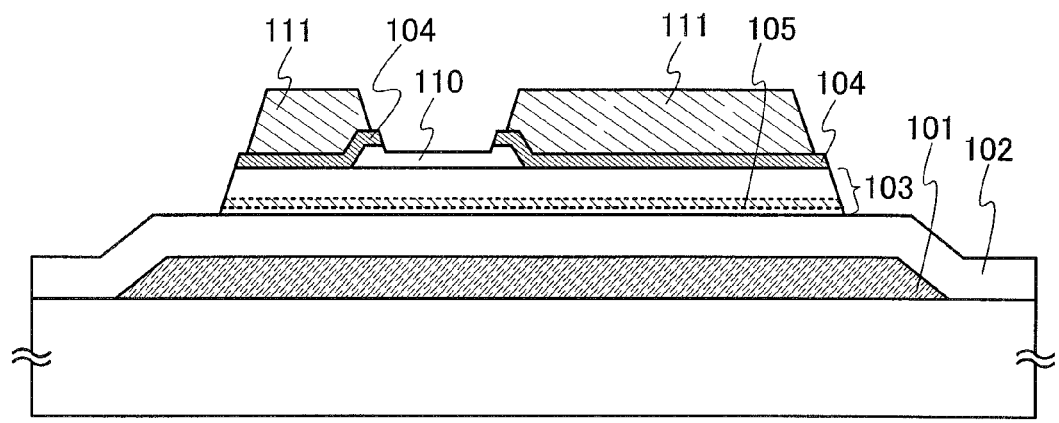

FIG. 2B shows an example of a cross-sectional view of a thin film transistor of the present invention which has a mode different from those of FIGS. 1A to 1C. In a thin film transistor shown in FIG. 2B, in a position overlapping with a conductive film 101 and over a semiconductor film 103, a channel protective film 110 is provided between a pair of semiconductor films 104. The channel protective film 110 can be formed by forming a silicon nitride film, a silicon oxide film, a silicon nitride oxide film, or a silicon oxynitride film over the semiconductor film 103, then selectively etching by a photolithography step. Alternatively, the channel protective film 110 can also be formed by discharging a composition containing polyimide, acrylic, or siloxane and baking it. The pair of semiconductor films 104 and a pair of conductive films 111 are provided after the channel protective film 110 is formed, whereby the semiconductor film 103 can be prevented from being partly etched due to etching which is performed in forming the pair of semiconductor films 104 and the pair of conductive films 111.

Figure 2C:
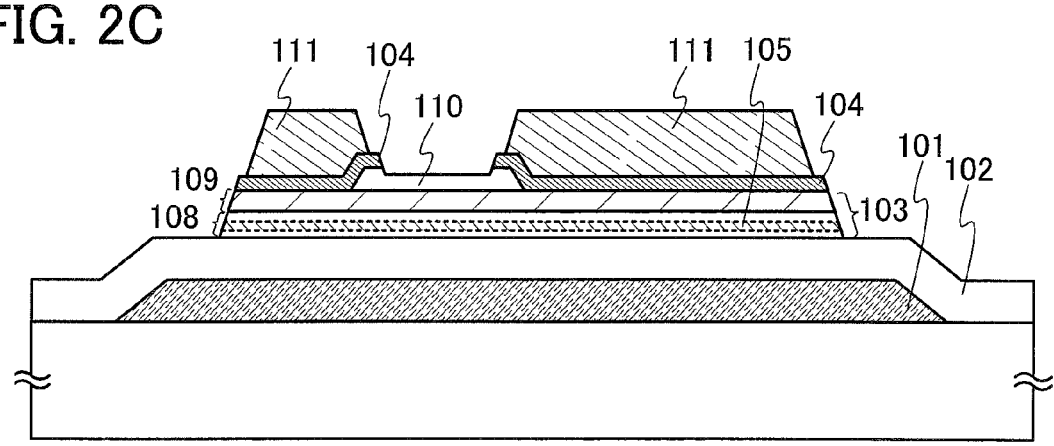

Note that the thin film transistor shown in FIG. 2A may have the channel protective film 110. In a thin film transistor shown in FIG. 2C, a semiconductor film 103 has a first semiconductor layer 108 including a microcrystalline semiconductor and a second semiconductor layer 109 including an amorphous semiconductor, in a manner similar to the thin film transistor shown in FIG. 2A. In addition, the thin film transistor shown in FIG. 2C has a channel protective film 110 in a manner similar to the thin film transistor shown in FIG. 2B.

A thin film transistor of the present invention can be used for manufacture of any kind of semiconductor devices including microprocessors, integrated circuits such as image processing circuits, RF tags for transmitting and receiving data with an interrogator without contact, semiconductor display devices, and the like. The semiconductor display device includes in its category, a liquid crystal display device, a light-emitting device provided with a light-emitting element typified by an organic light-emitting diode (OLED) in each pixel, a digital micromirror device (DMD), a plasma display panel (PDP), a field emission display (FED), and the like, and also includes another semiconductor display device having a circuit element using a semiconductor film in a driver circuit.

Embodiment Mode 2

This embodiment mode describes an example of a step for manufacturing a thin film transistor of the present invention. Although this embodiment mode explains as an example a method for manufacturing a thin film transistor which is shown in FIG. 2A, a manufacturing method described in this embodiment mode can also be applied to the methods for manufacturing a thin film transistor having any of other modes which are shown in FIGS. 1A to 1C and FIGS. 2B and 2C, as appropriate.

A thin film transistor having a microcrystalline semiconductor film which is of an n type is more suitable for use in a driver circuit than a thin film transistor having a microcrystalline semiconductor film which is of a p type because an n type has higher mobility. It is desired that all thin film transistors formed over the same substrate have the same polarity in order to reduce the number of steps. In this embodiment mode, description is made using an n-channel thin film transistor.

Figure 5A:
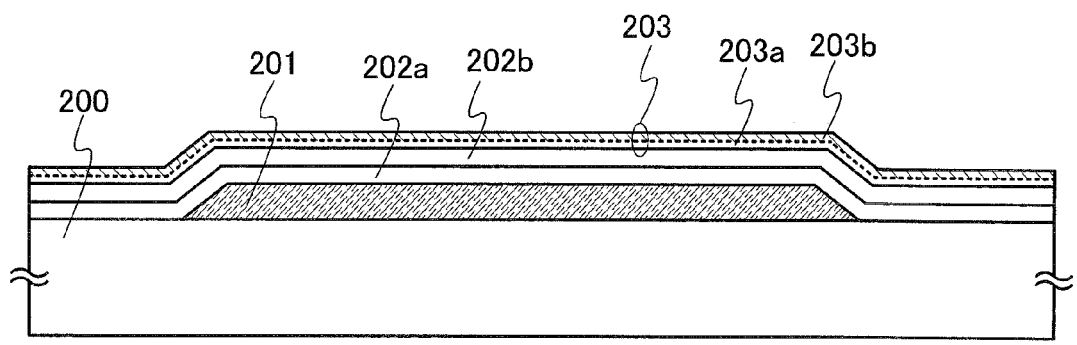
FIGS. 5A to 5C are diagrams illustrating a method for manufacturing a thin film transistor of the present invention.

As shown in FIG. 5A, a conductive film 201 functioning as a gate electrode is formed over a substrate 200, and gate insulating films 202a and 202b are formed over the conductive film 201.

The conductive film 201 is formed using a metal material. As the metal material, aluminum, chromium, titanium, tantalum, molybdenum, copper, or the like can be used. For example, the conductive film 201 may be formed using aluminum or a structural body in which aluminum and a barrier metal are stacked. As the barrier metal, a high-melting-point metal such as titanium, molybdenum, or chromium can be used. A barrier metal is preferably provided for preventing hillocks and oxidation of aluminum.

The conductive film 201 is formed to a thickness of from 50 nm to 300 nm. The thickness of from 50 nm to 100 nm of the conductive film 201 can prevent a disconnection of a semiconductor film and a conductive film which are formed later. Further, the thickness of from 150 nm to 300 nm of the conductive film 201 can lower the resistance of the conductive film 201, and can increase the size of the conductive film 201.

Note that over the conductive film 201, semiconductor films and gate insulating films are formed; therefore, the conductive film 201 is preferably processed to have tapered end portions so that the semiconductor films and the gate insulating films thereover are not disconnected. In addition, although not shown, in this step, a wiring connected to the gate electrode or a capacitor wiring can also be formed at the same time.

The conductive film 201 is formed by a sputtering method, a CVD method, a plating method, a printing method, a droplet discharge method, or the like. In this embodiment mode, a molybdenum film is formed by a sputtering method over the substrate 200 as a conductive film, and the conductive film formed over the substrate 200 is etched using a resist mask formed using a first photomask, so that the conductive film 201 is formed.

The gate insulating films 202a and 202b can each be formed by a CVD method, a sputtering method, or the like using a silicon oxide film, a silicon nitride film, a silicon oxynitride film, or a silicon nitride oxide film with a thickness of 50 nm to 150 nm. In this embodiment mode, a mode is described in which the gate insulating film 202a and the gate insulating film 202b are stacked, where the gate insulating film 202a is formed using a silicon nitride film or a silicon nitride oxide film and the gate insulating film 202b is formed using a silicon oxide film or a silicon oxynitride film. Note that the gate insulating film can be formed using a single layer of a silicon oxide film, a silicon nitride film, a silicon oxynitride film, or a silicon nitride oxide film, instead of using a two-layer structure.

By forming the gate insulating film 202a using a silicon nitride film or a silicon nitride oxide film, adhesion between the substrate 200 and the gate insulating film 202a is increased, and further, an impurity element from the substrate 200 can be prevented from diffusing into the microcrystalline semiconductor film when a glass substrate is used for the substrate 200. Furthermore, oxidation of the conductive film 201 can be prevented. That is to say, film peeling can be prevented, and thus electric characteristics of a thin film transistor which is completed later can be improved. Further, the gate insulating films 202a and 202b with a thickness of greater than or equal to 50 nm are preferable because the gate insulating films 202a and 202b with the above thickness can alleviate reduction in coverage of the conductive film 201 which is caused by unevenness.

Next, a semiconductor film 203 including a microcrystalline semiconductor is formed using a deposition gas including silicon or germanium, and hydrogen, over the gate insulating film 202b. The present invention describes an example in which the semiconductor film 203 is formed using the following two layers: a semiconductor layer 203a and a semiconductor layer 203b. The semiconductor layer 203a is a layer with low crystallinity which is formed at the beginning of film formation of the semiconductor film 203. The semiconductor layer 203b which includes an impurity element imparting one conductivity type and has higher crystallinity than the semiconductor layer 203a is formed after the semiconductor layer 203a.

For example, in the case where the semiconductor layer 203a and the semiconductor layer 203b each including a microcrystalline semiconductor are formed using silicon by a plasma CVD method, film formation may be performed by diluting a gas including silicon such as $SiH_4$, $Si_2H_6$, $SiH_2Cl_2$, $SiHCl_3$, $SiCl_4$, or $SiF_4$ with hydrogen, or with hydrogen and one or more kinds of noble gases selected from helium, argon, krypton, xenon, or neon and by using glow discharge plasma. In this embodiment mode, silane and hydrogen and/or a noble gas are introduced and mixed and high-frequency power is applied to produce glow discharge plasma, and the semiconductor film 203 including microcrystalline silicon is formed by the glow discharge plasma. In this case, silane is diluted 10-fold to 2000-fold with hydrogen and/or a noble gas. The heating temperature of the substrate is set at 100° C. to 300° C., preferably 120° C. to 220° C.

Note that the energy band gap may be adjusted to 0.9 eV to 1.1 eV by mixing germanium hydride or germanium fluoride such as $GeH_4$ or $GeF_4$ in a gas such as silane. By adding germanium to silicon, the temperature characteristic of a thin film transistor can be changed.

In order for an impurity element imparting one conductivity type to be included in the semiconductor layer 203b, an impurity element imparting one conductivity type may be added in forming the semiconductor layer 203b. In this embodiment mode, a gas including an impurity element, such as $PH_3$, is added to a gas including silicon in forming the semiconductor layer 203b. The peak concentration of an impurity element is set to be higher than or equal to $1\times10^{17}$ atoms/cm$^3$ and lower than or equal to $1\times10^{21}$ atoms/cm$^3$, preferably higher than or equal to $1\times10^{17}$ atoms/cm$^3$ and lower than or equal to $1\times10^{20}$ atoms/cm$^3$, more preferably higher than or equal to $1\times10^{17}$ atoms/cm$^3$ and lower than or equal to $1\times10^{19}$ atoms/cm$^3$.

The thickness of the semiconductor film 203 is set to be greater than or equal to 20 nm and less than or equal to 200 nm, more preferably greater than or equal to 10 nm and less than or equal to 100 nm. By setting the thickness of the semiconductor film 203 to be less than or equal to 50 nm, a fully-depletion type thin film transistor can be manufactured. A distance from the interface between the gate insulating film 202b and the semiconductor film 203 to the semiconductor layer 203b is, for example, from 3 nm to 20 nm, preferably from 10 nm to 15 nm, though it depends on the thickness of the semiconductor layer 203a with low crystallinity.

Note that a threshold voltage can be controlled by adding an impurity element which is to be an acceptor to the semiconductor film 203 at the same time as or after the film formation. A typical impurity element to be an acceptor is boron, and a gas including an impurity element, such as $B_2H_6$ or $BF_3$, may be mixed into a deposition gas including silicon or germanium at 1 ppm to 1000 ppm, preferably 1 ppm to 100 ppm. The concentration of boron may be about a tenth of that of an impurity element to be a donor; for example, the concentration of boron may be $1\times10^{14}$ atoms/cm$^3$ to $6\times10^{16}$ atoms/cm$^3$.

The semiconductor layer 203a which is formed at the beginning of film formation of the semiconductor film 203 including a microcrystalline semiconductor is a layer which is amorphous or which has a number of crystal defects; thus, the crystallinity of the semiconductor layer 203a is greatly lower than that of the semiconductor layer 203b which is formed later. In the semiconductor layer 203a which is present in the vicinity of the interface between the gate insulating film 202b and the semiconductor film 203, a channel formation region where majority carriers move is formed. Therefore, it has been difficult to further improve TFT characteristics such as mobility and ON current. However, in the present invention, the resistivity of the semiconductor layer 203b is made lower than that of the semiconductor layer 203a by adding an impurity element to the semiconductor layer 203b. Accordingly, majority carriers can be moved in the semiconductor layer 203b preferentially, that is, the semiconductor layer 203b with higher crystallinity can be made to function as a channel formation region, whereby mobility and ON current of the transistor can be improved.

Figure 5B:
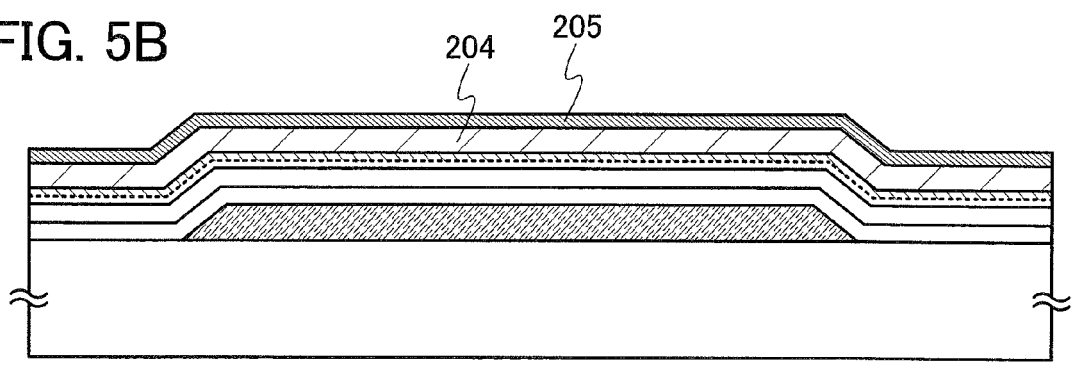

Next, a semiconductor film 204, and a semiconductor film 205 to which an impurity element imparting one conductivity type is added are formed over the semiconductor film 203 as shown in FIG. 5B.

The semiconductor film 204 including an amorphous semiconductor can be formed by a plasma CVD method using a deposition gas including silicon or germanium. Alternatively, the semiconductor film 204 including an amorphous semiconductor can be formed by diluting a deposition gas including silicon or germanium with one or more kinds of noble gases selected from helium, argon, krypton, or neon. Further alternatively, the semiconductor film 204 including an amorphous semiconductor to which hydrogen is added can be formed using hydrogen at a flow rate from 1 time to 10 times, preferably from 1 time to 5 times, as high as the flow rate of a silane gas. Further, a halogen such as fluorine or chlorine may be added to the hydrogenated semiconductor film.

Alternatively, sputtering with hydrogen or a noble gas is performed using a semiconductor target such as silicon or germanium as a target, whereby the semiconductor film 204 including an amorphous semiconductor can be formed.

Part of the semiconductor film 204 is etched in some cases in a later step of forming a source region and a drain region; therefore, in that case, the semiconductor film 204 is preferably formed to a thickness such that part of the second semiconductor film 204 remains. Typically, it is preferable to form the semiconductor film 204 with a thickness of from 30 nm to 500 nm, preferably from 50 nm to 200 nm. In a semiconductor display device in which high voltage is applied to a thin film transistor (for example, about 15 V), typically in a liquid crystal display device, by forming the semiconductor film 204 with a large thickness, a withstand voltage of a drain becomes high; thus, even when high voltage is applied to the thin film transistor, deterioration of the thin film transistor can be avoided.

By forming, over the surface of the semiconductor film 203, the semiconductor film 204 including an amorphous semiconductor, moreover, an amorphous semiconductor to which hydrogen, nitrogen, or a halogen is added, a surface of a microcrystal grain contained in the semiconductor film 203 can be prevented from being oxidized naturally. In particular, in a region where an amorphous semiconductor is in contact with a microcrystal grain, a crack is likely to be caused due to local stress. When this crack is exposed to oxygen, the crystal grain is oxidized, whereby silicon oxide is formed. However, by forming the semiconductor film 204 over the surface of the semiconductor film 203, the microcrystal grain can be prevented from being oxidized.

Since the semiconductor film 204 is formed using an amorphous semiconductor or an amorphous semiconductor including hydrogen or a halogen, the semiconductor film 204 has a larger energy gap and a higher resistance than the semiconductor film 203, and has a low mobility, i.e., mobility which is a fifth to a tenth of that of the semiconductor film 203. Thus, in the thin film transistor that is completed later, the semiconductor film 204 formed between the source and drain regions and the semiconductor film 203 functions as a high resistant region, and the semiconductor film 203 functions as a channel formation region. Accordingly, OFF current of the thin film transistor can be reduced. In the case of using the thin film transistor as a switching element of a semiconductor display device, contrast of the semiconductor display device can be improved.

Note that after the semiconductor film 203 is formed, the semiconductor film 204 is preferably formed by a plasma CVD method at a temperature of 300° C. to 400° C. By the film formation treatment, hydrogen is supplied to the semiconductor film 203 and thus an effect similar to the case where the semiconductor film 203 is hydrogenated can be achieved. That is, by depositing the semiconductor film 204 over the semiconductor film 203, hydrogen can be diffused to the semiconductor film 203 to terminate dangling bonds.

To the semiconductor film 205 to which an impurity element imparting one conductivity type is added, in the case of forming an n-channel thin film transistor, phosphorus may be added as a typical impurity element, and further, a gas including an impurity element such as $PH_3$ may be added to a deposition gas including silicon or germanium. To the semiconductor film 205 to which an impurity element imparting one conductivity type is added, in the case of forming a p-channel thin film transistor, boron may be added as a typical impurity element, and further, a gas including an impurity element such as $B_2H_6$ may be added to a deposition gas including silicon or germanium. The concentration of phosphorus or boron is set to $1\times10^{19}$ atoms/cm$^3$ to $1\times10^{21}$ atoms/cm$^3$, whereby the semiconductor film 205 can be subjected to ohmic contact with conductive films 206a to 206c to be formed later, and the semiconductor film 205 functions as a source region and a drain region. The semiconductor film 205 to which an impurity element imparting one conductivity type is added can be formed from a microcrystalline semiconductor or an amorphous semiconductor. The semiconductor film 205 to which an impurity element imparting one conductivity type is added is formed to a thickness of from 2 nm to 50 nm. By reducing the thickness of the semiconductor film 205 to which an impurity element imparting one conductivity type is added, throughput can be improved.

Figure 5C:
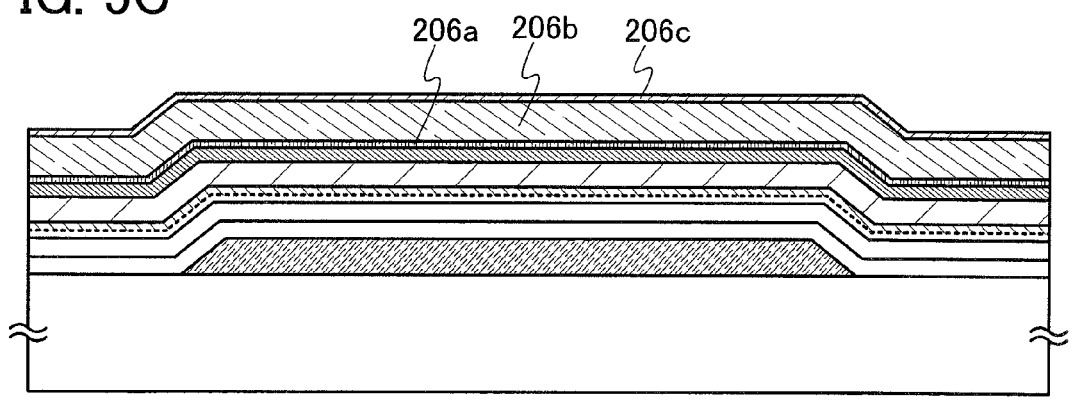

Next, a conductive film is formed over the semiconductor film 205 as shown in FIG. 5C. The conductive film is formed by a sputtering method, a CVD method, a printing method, a droplet discharge method, an evaporation method, or the like. The conductive film described in this embodiment mode, which has a three-layer structure in which the conductive films 206a to 206c are stacked, is a stacked conductive film using a molybdenum film for the conductive films 206a and 206c and using an aluminum film for the conductive film 206b, or a stacked conductive film using a titanium film for the conductive films 206a and 206c and using an aluminum film for the conductive film 206b. The conductive films 206a to 206c are formed by a sputtering method or a vacuum evaporation method.

The conductive film is preferably formed using a single layer or a stacked layer of aluminum, copper, or an aluminum alloy to which an element to prevent migration, an element to improve heat resistance, or an element to prevent a hillock, such as copper, silicon, titanium, neodymium, scandium, or molybdenum is added. Alternatively, the conductive film may have a stacked structure where a film in contact with the semiconductor film 205 to which an impurity element imparting one conductivity type is added is formed using titanium, tantalum, molybdenum, tungsten, or a nitride of any of these elements and an aluminum film or an aluminum alloy film is formed thereover. Still alternatively, the conductive film may have a stacked structure where aluminum or an aluminum alloy is sandwiched between upper and lower films of titanium, tantalum, molybdenum, tungsten, or a nitride of any of these elements.

Figure 6A:
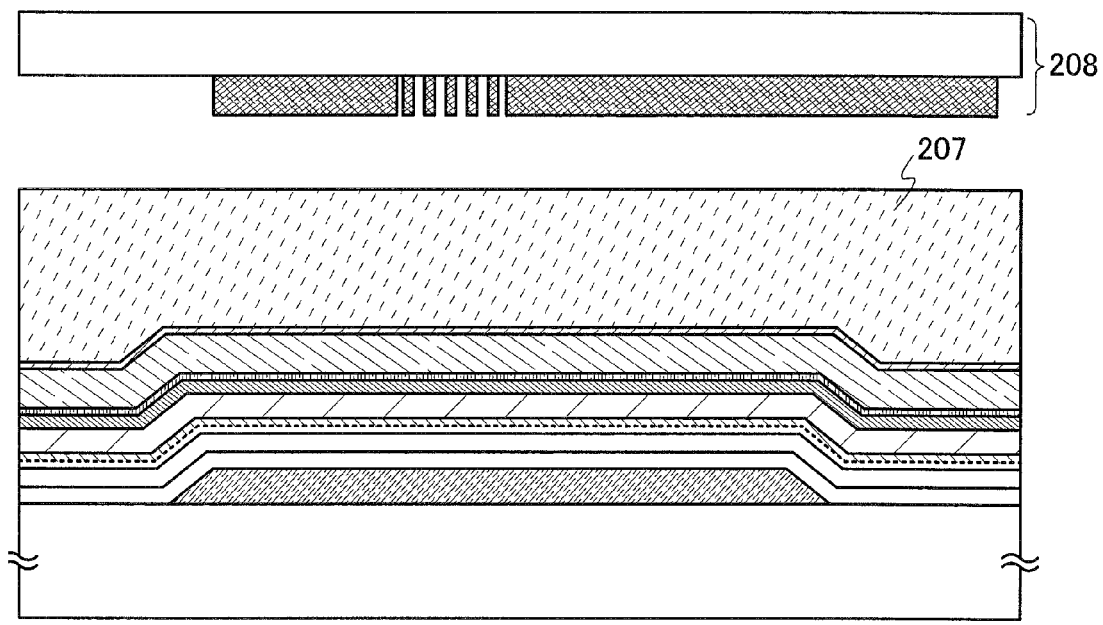
FIGS. 6A and 6B are diagrams illustrating a method for manufacturing a thin film transistor of the present invention.

Next, as shown in FIG. 6A, a resist 207 is applied over the conductive film 206c. The resist 207 can be a positive type resist or a negative type resist. In this embodiment mode, a positive type resist is used. Then, the resist 207 is partly exposed to light using a multi-tone mask 208.

A multi-tone mask has an exposed portion, a half-exposed portion, and an unexposed portion, whereby three levels of light exposure can be achieved. With the multi-tone mask, one-time exposure and development step allows a resist mask with regions of plural thicknesses (typically, two kinds of thicknesses) to be formed. Thus, the use of the multi-tone mask can reduce the number of photomasks.

As typical examples of the multi-tone mask, there are a gray-tone mask and a half-tone mask. A gray-tone mask includes a substrate having a light-transmitting property, and a light-blocking portion and a diffraction grating which are formed thereover. The light transmittance of the light-blocking portion is 0%. The diffraction grating has a light-transmitting portion in a slit form, a dot form, a mesh form, or the like with intervals less than or equal to the resolution limit of light used for the exposure; thus, the light transmittance can be controlled. The diffraction grating can have regularly-arranged slits, dots, or meshes form, or irregularly-arranged slits, dots, or meshes. For the substrate having a light-transmitting property, a substrate having a light-transmitting property, such as a quartz substrate, can be used. The light-blocking portion and the diffraction grating can be formed using a light-blocking material such as chromium or chromium oxide, which absorbs light. When the gray-tone mask is irradiated with light for exposure, a light transmittance of the light-blocking portion is 0% and that of a region where neither the light-blocking portion nor the diffraction grating are provided is 100%. The light transmittance of the diffraction grating can be controlled in a range of 10% to 70%. The light transmittance of the diffraction grating can be controlled with an interval or a pitch of slits, dots, or meshes of the diffraction grating.

A half-tone mask includes a substrate having a light-transmitting property, and a semi-transmissive portion and a light-blocking portion which are formed thereover. The semi-transmissive portion can be formed using MoSiN, MoSi, MoSiO, MoSiON, CrSi, or the like. The light-blocking portion can be formed of a light-blocking material by which light is absorbed, such as chromium or chromium oxide. When the half-tone mask is irradiated with light for exposure, the light transmittance of the light-blocking portion is 0% and that of a region where neither the light-blocking portion nor the semi-transmissive portion is provided is 100%. The light transmittance of the semi-transmissive portion can be controlled in a range of 10% to 70%. The light transmittance of the semi-transmissive portion can be controlled by selection of the material of the semi-transmissive portion.

Figure 6B:
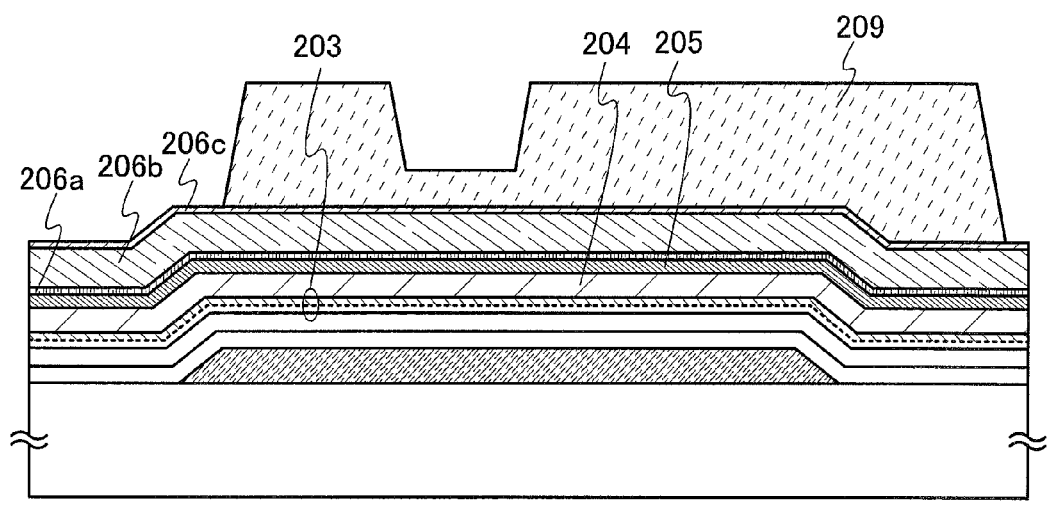

After the light exposure using the multi-tone mask is performed, development is carried out, whereby a resist mask 209 having regions with different thicknesses can be formed, as shown in FIG. 6B.

Figure 7A:
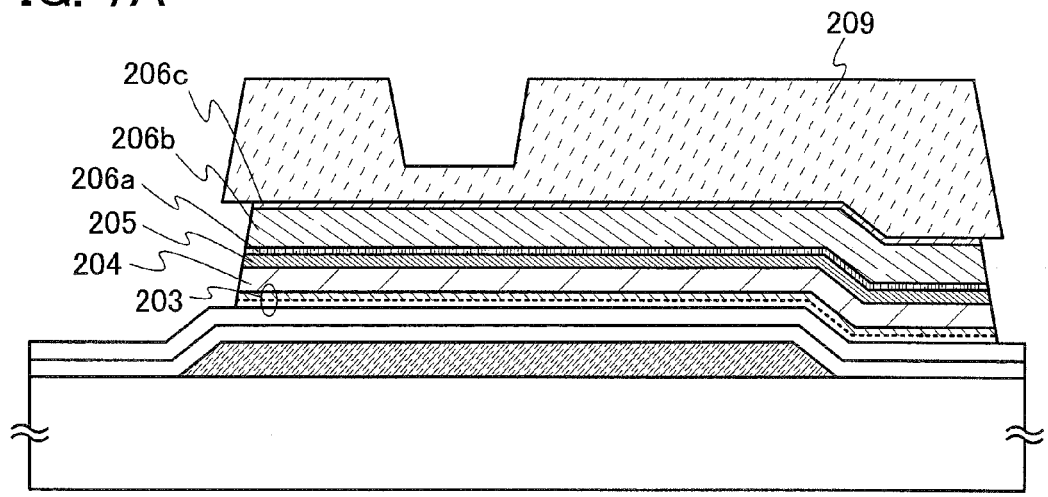
FIGS. 7A to 7C are diagrams illustrating a method for manufacturing a thin film transistor of the present invention.
Figure 9:
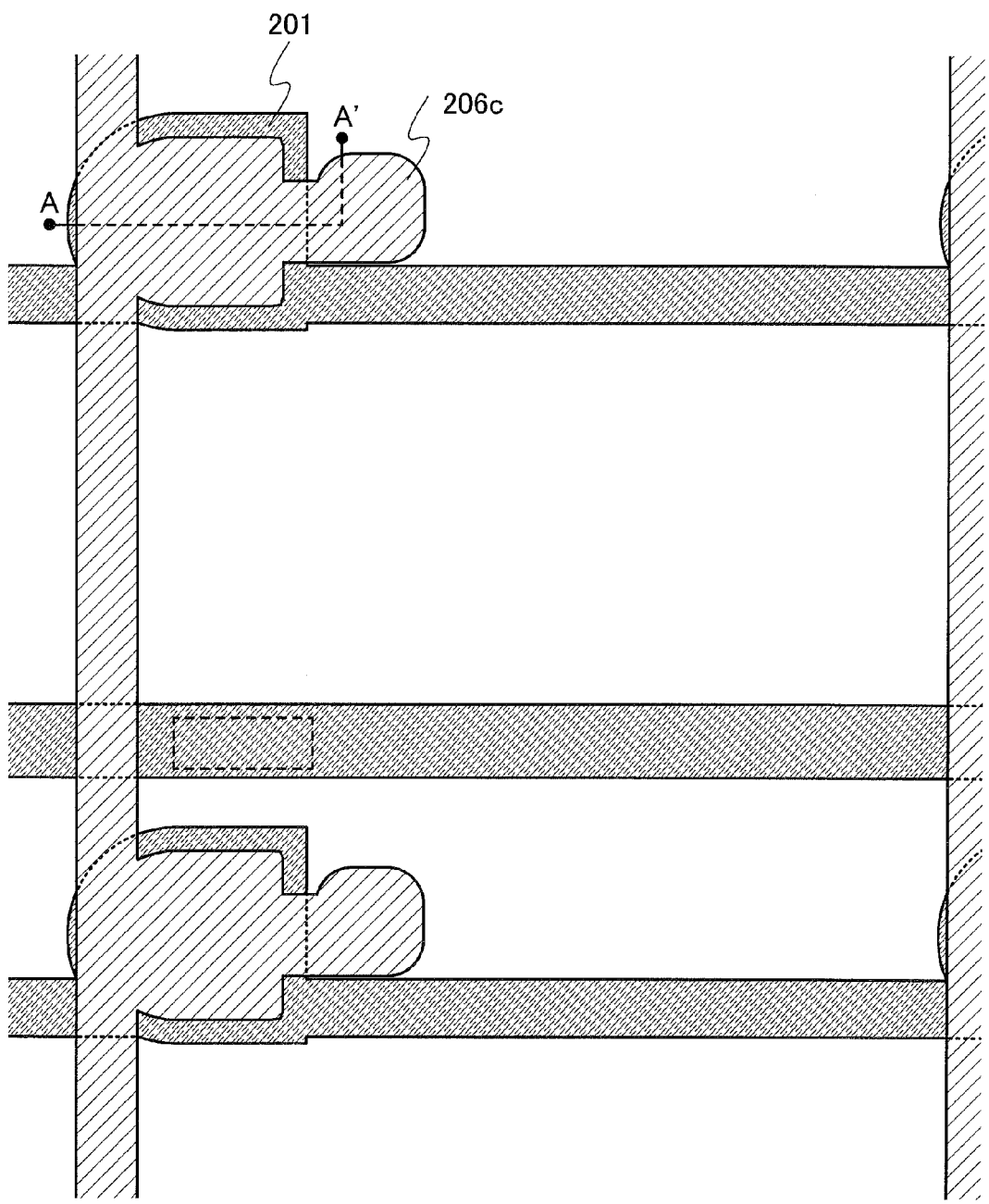
FIG. 9 is a diagram illustrating a method for manufacturing a thin film transistor of the present invention.

Next, the semiconductor film 203, the semiconductor film 204, the semiconductor film 205 to which an impurity element imparting one conductivity type is added, and the conductive films 206a to 206c are etched using the resist mask 209. As a result, as shown in FIG. 7A, the semiconductor film 203, the semiconductor film 204, the semiconductor film 205 to which an impurity element imparting one conductivity type is added, and the conductive films 206a to 206c can be processed into a desired shape. Note that FIG. 7A (excluding the resist mask 209) corresponds to a cross-sectional view taken along dashed line A-A' in FIG. 9.

Figure 7B:
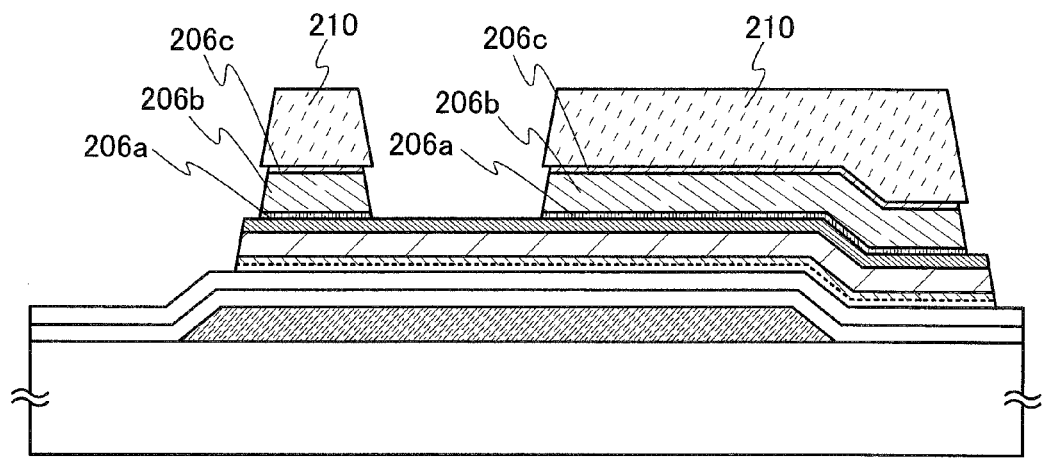

Next, ashing is conducted on the resist mask 209. As a result, the area and the thickness of the resist are reduced. At this time, a region of the resist with a small thickness (a region of the resist which overlaps with part of the conductive film 201) is removed, whereby separated resist masks 210 can be formed as shown in FIG. 7B.

Then, the conductive films 206a to 206c are further etched using the resist mask 210, so that the conductive films 206a to 206c are separated. As a result, a pair of conductive films 206a to 206c as shown in FIG. 7B can be formed.

Figure 7C:
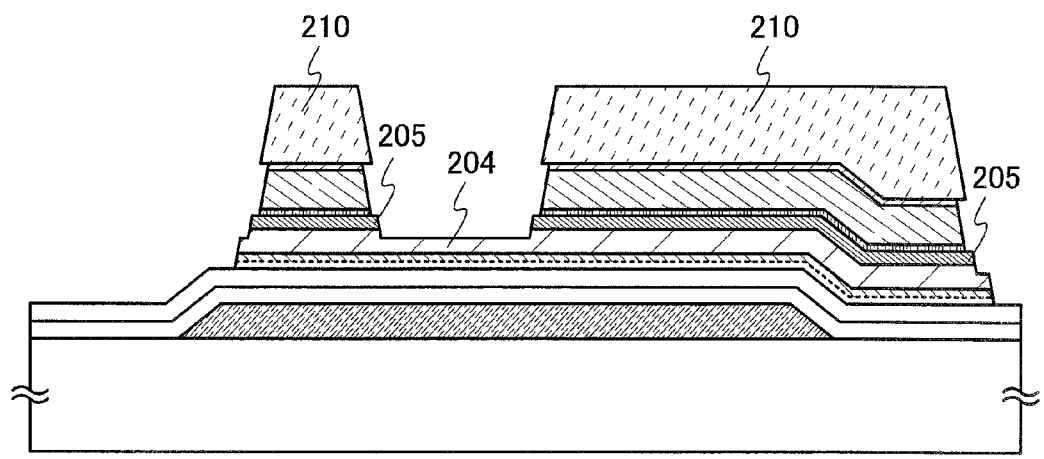

Next, as shown in FIG. 7C, the semiconductor film 205 to which an impurity element imparting one conductivity type is added is etched using the resist mask 210 to be separated, so that a pair of semiconductor films 205 functioning as a source region and a drain region is formed. Note that part of the semiconductor film 204 is also etched in the etching step; thus, a depression is formed in the semiconductor film 204. The formation of the pair of semiconductor films 205 functioning as a source region and a drain region can be performed in the same step as the formation of the depression in the semiconductor film 204. The depth of the depression in the semiconductor film 204 is set to half to one-third of the thickness of the thickest region in the semiconductor film 204, so that a distance between the source region and the drain region can be increased. Accordingly, leakage current between the source region and the drain region can be reduced.

In this embodiment mode, part of the semiconductor film 204 is etched using the resist mask 210 with a reduced area as compared to the resist mask 209, so that the end portion of part of the semiconductor film 204 is located beyond the end portions of the pair of semiconductor films 205 functioning as a source region and a drain region. Further, the end portions of the conductive films 206a to 206c are not aligned with the end portions of the pair of semiconductor films 205 functioning as a source region and a drain region. Thus, the end portions of the pair of semiconductor films 205 are located beyond the end portions of the conductive films 206a to 206c. After that, the resist mask 210 is removed.

Figure 10:
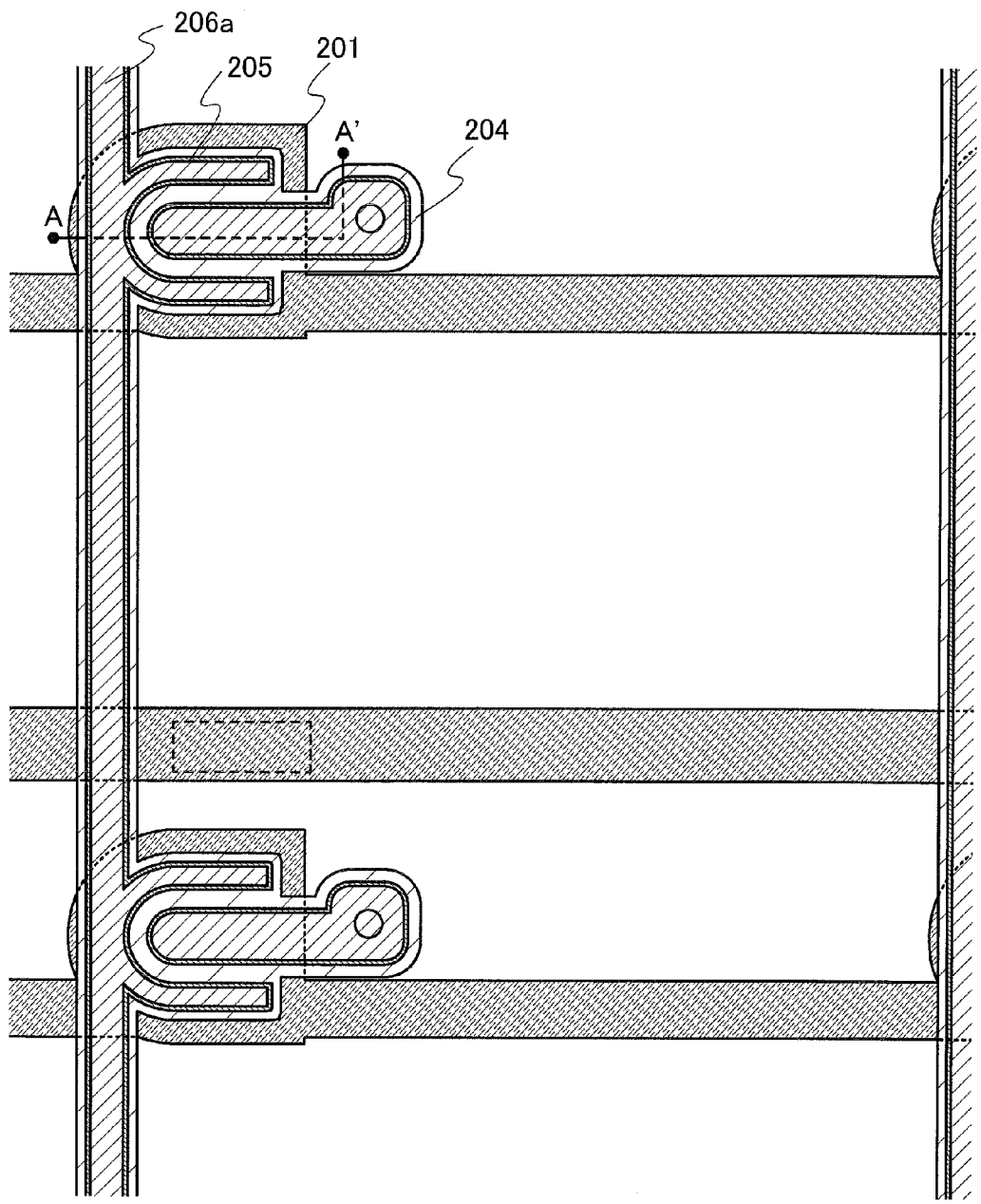
FIG. 10 is a diagram illustrating a method for manufacturing a thin film transistor of the present invention.

Note that FIG. 7C (excluding the resist mask 210) corresponds to a cross-sectional view taken along dashed line A-A' in FIG. 10. As shown in FIG. 10, the end portions of the pair of semiconductor films 205 functioning as a source region and a drain region are located beyond the end portions of the conductive films 206a to 206c. The end portion of the semiconductor films 204 is located beyond the end portions of the conductive films 206a to 206c and the pair of semiconductor films 205. Further, one of the pair of conductive films 206a to 206c has a shape surrounding part of the other of the pair of conductive films 206a to 206c (specifically, a U shape or a C shape). Accordingly, the area of a region where carriers move can be enlarged, and thus, the amount of current can be increased while the area of a thin film transistor is kept small.

Next, dry etching may be performed under such a condition that the semiconductor film 204 which is exposed is not damaged and an etching rate with respect to the semiconductor film 204 is low. Through this dry etching step, an etching residue on the semiconductor film 204 between the pair of semiconductor films 205, a residue of the resist mask, and a contamination source in the apparatus used for removal of the resist mask can be removed, whereby insulation between the pair of semiconductor films 205 can be ensured. As a result, leakage current of the thin film transistor can be reduced, so that a thin film transistor with a small OFF current and a high withstand voltage can be manufactured. Note that a gas containing chlorine, a gas containing fluorine, or the like can be used for an etching gas, for example.

Through the above step, a channel-etched thin film transistor can be formed.

Figure 8A:
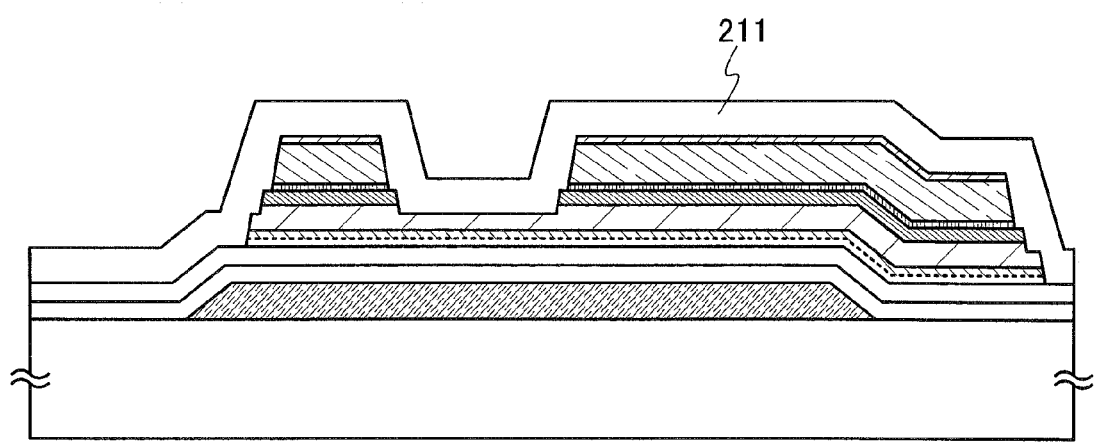
FIGS. 8A and 8B are diagrams illustrating a method for manufacturing a thin film transistor of the present invention.

Next, as shown in FIG. 8A, a protective insulating film 211 is formed over the conductive films 206a to 206c, the pair of semiconductor films 205, the semiconductor film 204, the semiconductor film 203, and the gate insulating film 202b. The protective insulating film 211 is a film for preventing intrusion of a contaminating impurity such as an organic matter, a metal, or water vapor which is included in the air; thus, a dense film is preferably used for the protective insulating film 211. Further, by using a silicon nitride film as the protective insulating film 211, the oxygen concentration of the semiconductor film 204 can be set at less than or equal to $5 \times 10^{19}$ atoms/cm$^3$, preferably less than or equal to $1 \times 10^{19}$ atoms/cm$^3$. Accordingly, the semiconductor film 204 can be prevented from being oxidized.

Figure 8B:
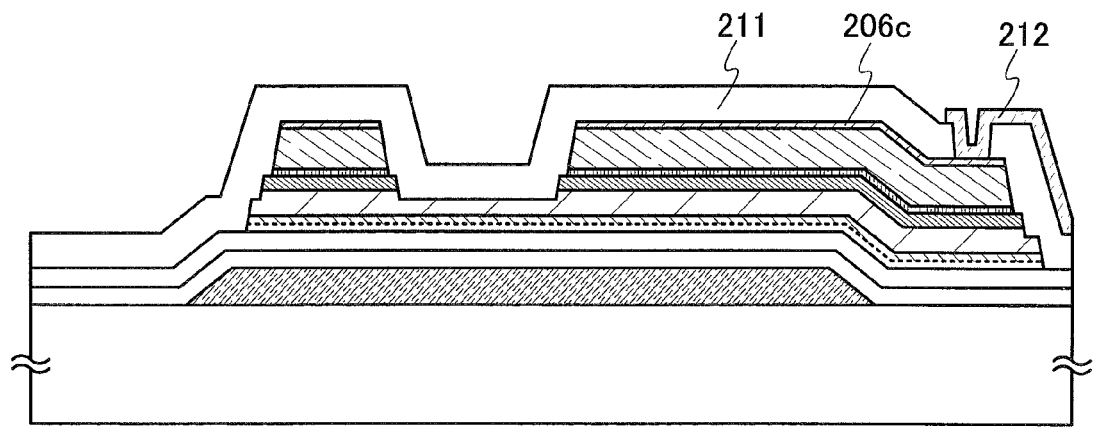
Figure 11:
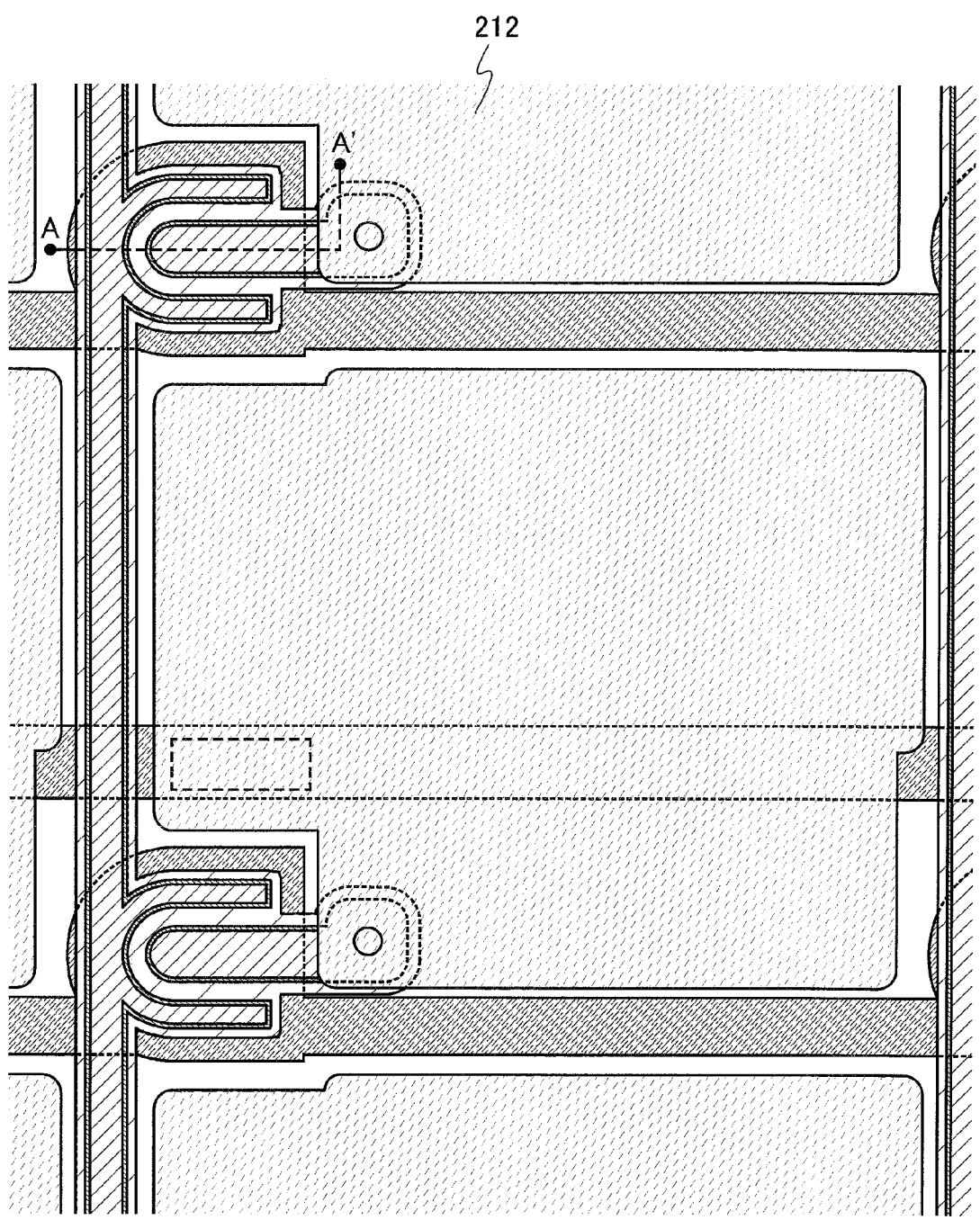
FIG. 11 is a diagram illustrating a method for manufacturing a thin film transistor of the present invention.

As shown in FIG. 8B, part of the protective insulating film 211 is etched to form a contact hole. Then, a pixel electrode 212 in contact with the conductive film 206c is formed in the contact hole. In this embodiment mode, the pixel electrode 212 can be obtained by forming a film using ITO by a sputtering method, then processing the film into a desired shape by etching or the like. Note that FIG. 8B corresponds to a cross-sectional view taken along dashed line A-A' in FIG. 11.

The pixel electrode 212 can be formed using a light-transmitting conductive material such as indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added.

The pixel electrode 212 can be formed using a conductive composition including a conductive high-molecular compound (also referred to as a conductive polymer). It is preferable that a pixel electrode formed using a conductive composition have sheet resistance of less than or equal to 10000 Ω/square and light transmittance of greater than or equal to 70% at a wavelength of 550 nm. In addition, the resistivity of the conductive high-molecular compound which is included in the conductive composition is desirably less than or equal to 0.1 Ω·cm.

As the conductive high-molecular compound, a so-called π electron conjugated conductive high-molecular compound can be used. Examples thereof include polyaniline and its derivatives, polypyrrole and its derivatives, polythiophene and its derivatives, and copolymers of two or more kinds of them.

Accordingly, a thin film transistor and an element substrate which can be used for a semiconductor display device having the thin film transistor can be formed.

Next, a process in which a contact hole and a capacitor can be formed with one photomask is described below.

After forming the protective insulating film 211 as shown in FIG. 8A, an insulating film 220 is formed over the protective insulating film 211 as shown in FIG. 12A. In this embodiment mode, the insulating film 220 is formed using a photosensitive organic resin. Then, the insulating film 220 is exposed to light using a multi-tone mask 221 and developed, whereby an opening 222 which selectively exposes a portion of the protective film 211 overlapping with the conductive film 206c is formed, and a depression 224 is formed over a capacitor wiring 223 as shown in FIG. 12B. In this embodiment mode, the multi-tone mask 221 is used with which a region to be the opening 222 can be exposed to light by 100% and a region in the insulating film 220 to be the depression 224 can be exposed to light by 10% to 70%.

Then, the protective insulating film 211 is etched using the insulating film 220 having the depression 224 and the opening 222 as a mask, whereby the conductive film 206c is partly exposed as shown in FIG. 12B.

Figure 13A:
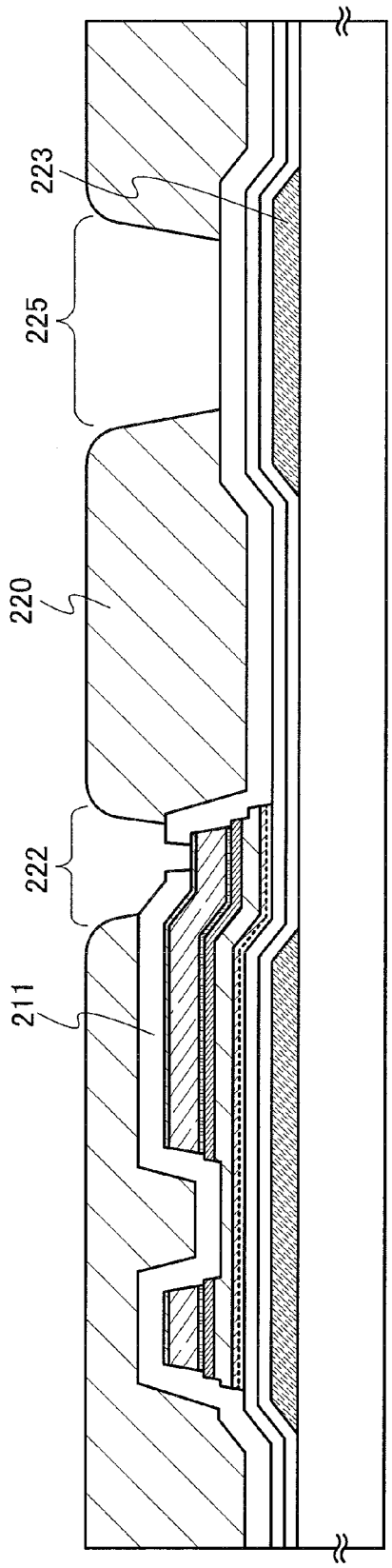
FIGS. 13A and 13B are diagrams illustrating a method for manufacturing a semiconductor device including a thin film transistor of the present invention.

Next, a whole surface of the insulating film 220 having the depression 224 and the opening 222 is etched (etch back), whereby the depression 224 and the opening 222 are extended. Finally, the opening 222 which is widen and an opening 225 which is obtained as a result of extending the depression 224 are formed in the insulating film 220 as shown in FIG. 13A. The opening 225 is formed in a region overlapping with the capacitor wiring 223.

Figure 13B:
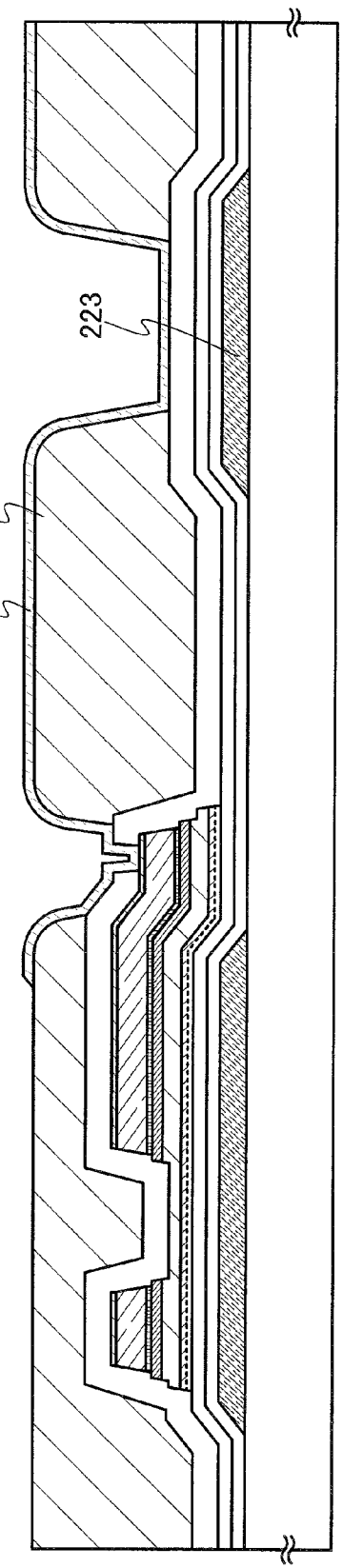

After that, a pixel electrode 212 is formed in contact with the conductive film 206c, and further, and a capacitor including the capacitor wiring 223, the gate insulating films 202a and 202b, the protective insulating film 211, and the pixel electrode 212 can be formed as shown in FIG. 13B.

Through the above-described step, the contact hole which connects the pixel electrode and the conductive film 206c functioning as a wiring, and the capacitor can be formed using one multi-tone mask.

In this embodiment mode, a channel-etched thin film transistor is described; however, a channel protective thin film transistor can be similarly formed. Specifically, steps up to the formation of a semiconductor film 204 over a semiconductor film 203 are performed as shown in FIG. 5B. Then, a channel protective film is formed in a region overlapping with a conductive film 201 and over the semiconductor film 204. The channel protective film can be obtained by forming a silicon nitride film, a silicon oxide film, a silicon nitride oxide film, or a silicon oxynitride film, then selectively etching by a photolithography step. Alternatively, the channel protective film can also be formed by discharging a composition containing polyimide, acrylic, or siloxane and baking it.

Next, a semiconductor film 205 to which an impurity element imparting one conductivity type is added and conductive films 206a, 206b, and 206c are formed in this order. Then, the conductive films 206a, 206b, and 206c, the semiconductor film 205 to which an impurity element imparting one conductivity type is added, the semiconductor film 204, and the semiconductor film 203 are etched using a resist mask formed by a photolithography step. By the etching, the conductive films 206a, 206b, and 206c become pairs of separated conductive films 206a, 206b, and 206c, and the semiconductor film 205 becomes pairs of separated semiconductor films 205. Further, by the etching, the semiconductor film 204 and the semiconductor film 203 are also formed into island-like patterns.

Through the above step, a channel protective type thin film transistor can be formed.

Further, gate insulating films of three layers may be formed as a substitute for the gate insulating films 202a and 202b of the thin film transistor shown in FIG. 5A. As a gate insulating film in a third layer, a silicon nitride film or a silicon nitride oxide film with a thickness of approximately 1 nm to 5 nm can be formed. The silicon nitride film or the silicon nitride oxide film with a thickness of approximately 1 nm to 5 nm, which is formed as the gate insulating film in the third layer, can be formed by a plasma CVD method. Alternatively, a silicon nitride layer can be formed over a surface of the gate insulating film 202b by subjecting the gate insulating film 202b to nitridation treatment using dense plasma. By performing nitridation treatment using dense plasma, a silicon nitride layer including nitrogen at a high concentration can be obtained. Dense plasma is produced by using a microwave at a high frequency, for example, using 2.45 GHz. Since such dense plasma having a feature of low electron temperature has a low kinetic energy of active species, a layer having few defects can be formed with few plasma damages as compared to conventional plasma treatment. In addition, with use of dense plasma, the roughness on the surface of the gate insulating film 202b can be reduced, whereby carrier mobility can be increased.

Further, after the gate insulating films 202a and 202b are formed, a source gas of the gate insulating film 202a and 202b, particularly, a gas including oxygen or nitrogen, which is left in the reaction chamber, is preferably removed by making a deposition gas including silicon or germanium flow into a reaction chamber of a film formation apparatus. By this step, the oxygen concentration or the nitrogen concentration of the reaction chamber can be reduced, and the oxygen concentration or the nitrogen concentration of the microcrystalline semiconductor film which is to be formed later can be reduced. As a result, a microcrystalline semiconductor film with few defects can be formed.

Embodiment Mode 3

This embodiment mode describes a structure of a liquid crystal display device using a thin film transistor of the present invention as a switching element.

Figure 14:
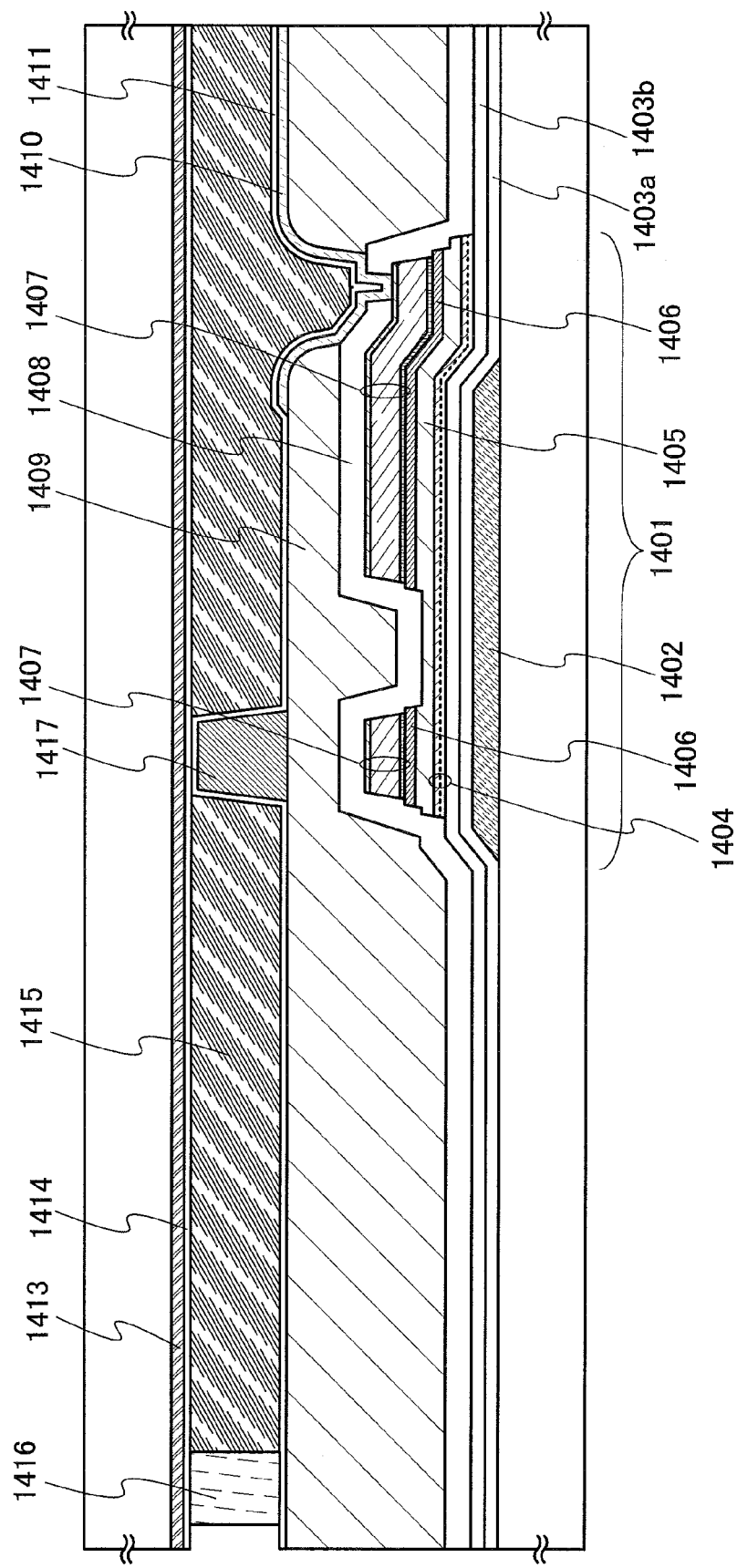
FIG. 14 is a cross-sectional view of a liquid crystal display device of the present invention.

FIG. 14 illustrates as an example a cross-sectional view of a liquid crystal display device of the present invention. A thin film transistor 1401 shown in FIG. 14 has a conductive film 1402 formed over an insulating surface; gate insulating films 1403a and 1403b formed to cover the conductive film 1402; a semiconductor film 1404 including a microcrystalline semiconductor which is formed to overlap with the conductive film 1402 with the gate insulating films 1403a and 1403b interposed therebetween; a semiconductor film 1405 including an amorphous semiconductor which is formed over the semiconductor film 1404; and a pair of semiconductor films 1406 functioning as a source region and a drain region, which is formed over the semiconductor film 1405.

A pair of conductive films 1407 functioning as wirings is formed over the pair of semiconductor films 1406. A protective insulating film 1408 and an insulating film 1409 are sequentially stacked to cover the thin film transistor 1401 and the conductive films 1407. Part of the protective insulating film 1408 and the insulating film 1409 is provided with an opening, and a pixel electrode 1410 is formed to be in contact with one of the conductive films 1407 in the opening.

Further, a spacer 1417 for controlling a cell gap of a liquid crystal element is formed over the insulating film 1409. An insulating film is etched to have a desired shape, so that the spacer 1417 can be formed. A cell gap may also be controlled by dispersing a filler on the insulating film 1409.

An alignment film 1411 is formed over the pixel electrode 1410. The alignment film 1411 can be formed by subjecting an insulating film to rubbing treatment. Further, a counter electrode 1413 is provided in a position opposed to the pixel electrode 1410, and an alignment film 1414 is formed on the side of the counter electrode 1413 which is close to the pixel electrode 1410. Furthermore, a liquid crystal 1415 is provided in a region which is surrounded by a sealant 1416 between the pixel electrode 1410 and the counter electrode 1413. Note that a filler may be mixed in the sealant 1416.

The pixel electrode 1410 and the counter electrode 1413 can be formed of, for example, indium tin oxide including silicon oxide (ITSO), indium tin oxide (ITO), zinc oxide (ZnO), indium zinc oxide (IZO), gallium-doped zinc oxide (GZO), or the like. Note that this embodiment mode describes an example of manufacturing a transmissive type liquid crystal element by using a light-transmitting conductive film for the pixel electrode 1410 and the counter electrode 1413. However, the present invention is not limited to this structure. The liquid crystal display device of the present invention may be a semi-transmissive type liquid crystal display device or a reflective type liquid crystal display device.

Further, the liquid crystal display device shown in FIG. 14 may be provided with a color filter.

Although a liquid crystal display device of a TN (twisted nematic) mode is described in this embodiment mode, the thin film transistor of the present invention can be used for other liquid crystal display devices of a VA (vertical alignment) mode, an OCB (optically compensated birefringence) mode, an IPS (in-plane-switching) mode, and the like.

In the liquid crystal display device of the present invention, a highly reliable thin film transistor with high mobility and ON current is used; therefore, the liquid crystal display device of the present invention has high contrast and high visibility.

Embodiment 1

This embodiment describes an embodiment of a semiconductor display device of the present invention.

Figure 15A:
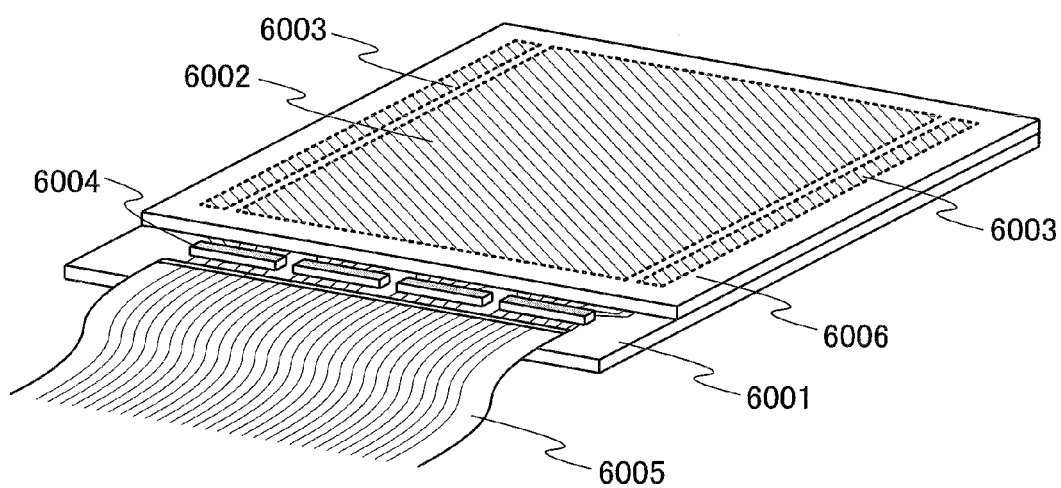
FIGS. 15A and 15B are perspective views illustrating an embodiment of a semiconductor display device of the present invention.
Figure 15B:
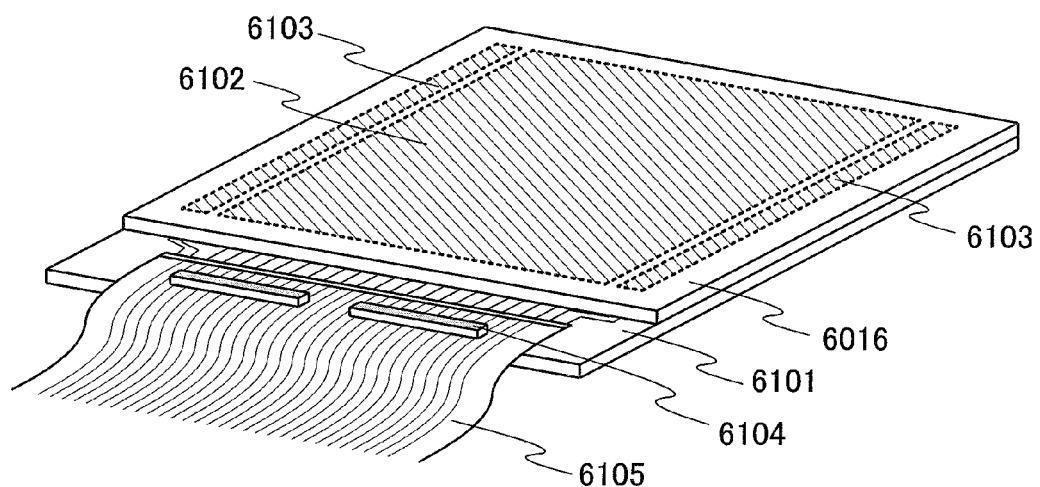

FIGS. 15A and 15B show perspective views of semiconductor display devices in each of which chip-like ICs (IC chips) are mounted on a display panel.

In a display panel shown in FIG. 15A, a pixel portion 6002 and a scan line driver circuit 6003 are formed between a substrate 6001 and a substrate 6006. A signal line driver circuit with which the IC chip 6004 is provided is mounted on the substrate 6001. Specifically, the signal line driver circuit with which the IC chip 6004 is provided is attached to the substrate 6001 and electrically connected to the pixel portion 6002. Reference numeral 6005 denotes an FPC through which electric power, various kinds of signals, and the like are supplied to the pixel portion 6002, the scan line driver circuit 6003, and the signal line driver circuit with which the IC chip 6004 is provided.

In the display panel shown in FIG. 15B, a pixel portion 6102 and a scan line driver circuit 6103 are formed between a substrate 6101 and a substrate 6016. A signal line driver circuit with which an IC chip 6104 is provided is further mounted on the FPC 6105 which is mounted on the substrate 6101. Through the FPC 6105, electric power, various kinds of signals, and the like are supplied to the pixel portion 6102, the scan line driver circuit 6103, and the signal line driver circuit with which the IC chip 6104 is provided.

A mounting method of the IC chip is not particularly limited, and a known COG method, wire bonding method, TAB method, or the like can be used. Also, a position where the IC chip is mounted is not limited to the position shown in FIGS. 15A and 15B as long as electrical connection is possible. Although the example of using the IC chip only for forming the signal line driver circuit is described in FIGS. 15A and 15B, a scan line driver circuit may be formed by using an IC chip. In addition, a controller, a CPU, a memory, or the like may be formed by using an IC chip and may be mounted. In addition, an IC chip may be used to form not a whole signal line driver circuit or scanning line driver circuit but one portion of a circuit included in the driver circuits.

Note that, by mounting a separately-mounted integrated circuit such as a driver circuit using an IC chip, yield can be improved and optimization of a process in accordance with characteristics of each circuit can be easily performed, as compared to a case of forming all circuits over the same substrate as a pixel portion.

This embodiment can be implemented by being combined with any of the above-described embodiment modes.

Embodiment 2

This embodiment describes arrangement of a liquid crystal panel and a light source in a liquid crystal display device of the present invention.

Figure 16:
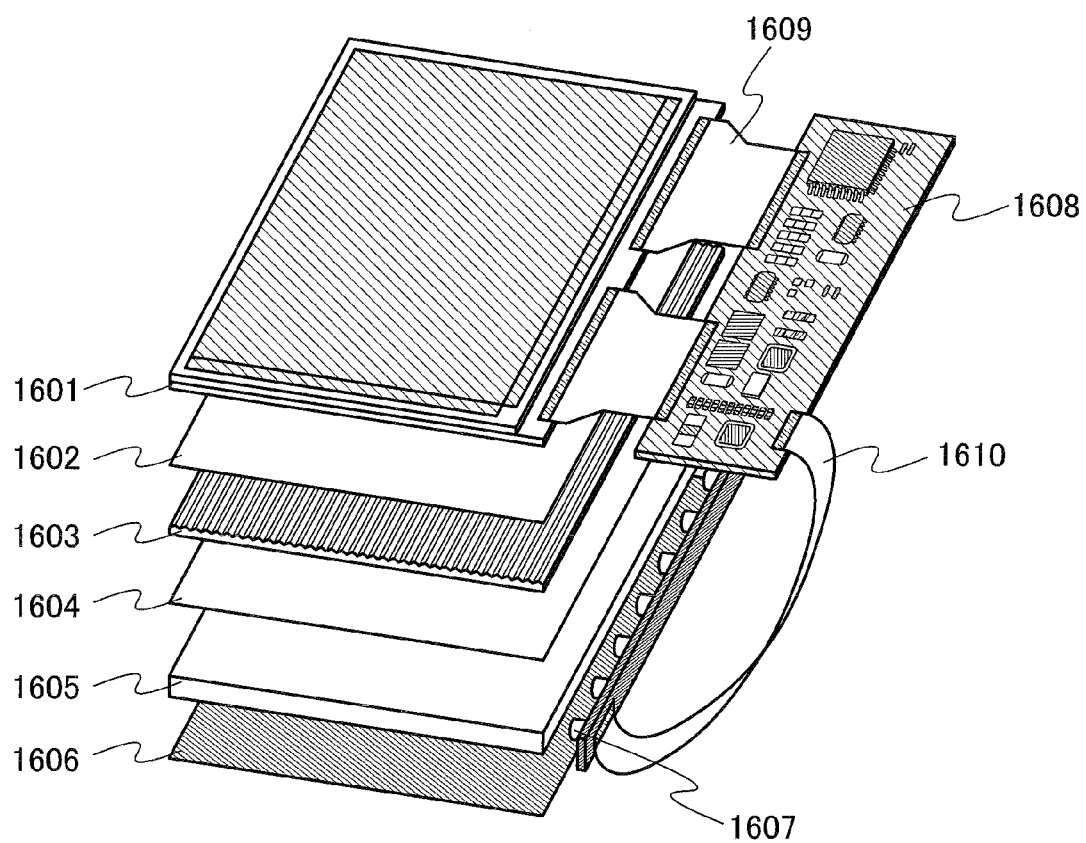
FIG. 16 is a perspective view illustrating a structure of a liquid crystal display device of the present invention.

FIG. 16 illustrates an example of a perspective view showing a structure of a liquid crystal display device of the present invention. The liquid crystal display device shown in FIG. 16 is provided with a liquid crystal panel 1601 in which a liquid crystal element is formed between a pair of substrates; a first diffusing plate 1602; a prism sheet 1603; a second diffusing plate 1604; a light guide plate 1605; a reflection plate 1606; a light source 1607; and a circuit substrate 1608.

The liquid crystal panel 1601, the first diffusing plate 1602, the prism sheet 1603, the second diffusing plate 1604, the light guide plate 1605, and the reflection plate 1606 are stacked in this order. The light source 1607 is provided at an end portion of the light guide plate 1605. The liquid crystal panel 1601 is uniformly irradiated with light from the light source 1607 which is diffused inside the light guide plate 1605, due to the first diffusing plate 1602, the prism sheet 1603, and the second diffusing plate 1604.

Although the first diffusing plate 1602 and the second diffusing plate 1604 are used in this embodiment, the number of diffusing plates is not limited thereto. The number of diffusing plates may be one, or may be three or more. It is acceptable as long as the diffusing plate is provided between the light guide plate 1605 and the liquid crystal panel 1601. Therefore, a diffusing plate may be provided only on the side closer to the liquid crystal panel 1601 than the prism sheet 1603, or may be provided only on the side closer to the light guide plate 1605 than the prism sheet 1603.

Further, the cross section of the prism sheet 1603 is not limited to a sawtooth-shape shown in FIG. 16. The prism sheet 1603 may have a shape with which light from the light guide plate 1605 can be concentrated on the liquid crystal panel 1601 side.

The circuit substrate 1608 is provided with a circuit which generates various kinds of signals input to the liquid crystal panel 1601, a circuit which processes the signals, or the like. In FIG. 16, the circuit substrate 1608 and the liquid crystal panel 1601 are connected to each other via a flexible printed circuit (FPC) 1609. Note that the circuit may be connected to the liquid crystal panel 1601 by using a chip ON glass (COG) method, or part of the circuit may be connected to the FPC 1609 by using a chip ON film (COF) method.

FIG. 16 shows an example in which the circuit substrate 1608 is provided with various kinds of circuits which control driving of the light source 1607 where the circuits and the light source 1607 are connected via the FPC 1610. However, various kinds of circuits which control driving of the light source 1607 may be formed in the liquid crystal panel 1601; in this case, the liquid crystal panel 1601 and the light source 1607 are connected via an FPC or the like.

Although FIG. 16 shows as an example of an edge-light type light source in which the light source 1607 is disposed at an end portion of the liquid crystal panel 1601, a liquid crystal display device of the present invention may be a direct type that includes the light source 1607 disposed directly below the liquid crystal panel 1601.

This embodiment can be implemented by being combined with any of the above-described embodiment modes and embodiment, as appropriate.

Embodiment 3

As an electronic device which can use the semiconductor device of the present invention, a mobile phone, a portable game machine, an electronic book, a video camera, a digital still camera, a goggle-type display (a head mounted display), a navigation system, an audio reproducing device (e.g., a car audio component or an audio component set), a laptop computer, an image reproducing device provided with a recording medium (typically, a device for reproducing a recording medium such as a digital versatile disc (DVD) and having a display for displaying the reproduced image) and the like can be given. Specific examples of these electronic devices are shown in FIGS. 17A to 17C.

Figure 17A:
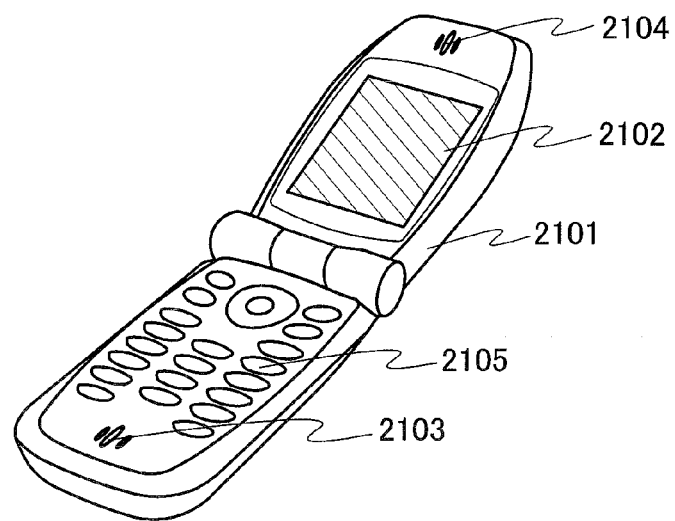
FIGS. 17A to 17C are diagrams showing electronic devices using semiconductor devices of the present invention.

FIG. 17A shows a cellular phone which includes a main body 2101, a display portion 2102, an audio input portion 2103, an audio output portion 2104, and operation keys 2105. By using the semiconductor device of the present invention for the display portion 2102, a highly reliable cellular phone with high contrast and high visibility is obtained.

Figure 17B:
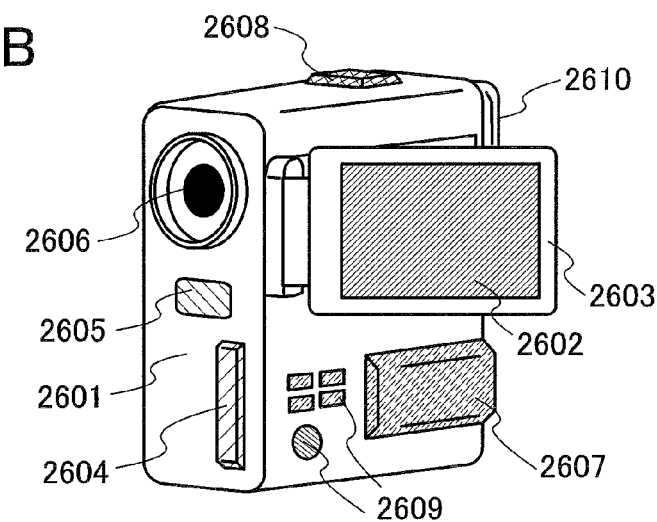

FIG. 17B shows a video camera which includes a main body 2601, a display portion 2602, a housing 2603, an external connection port 2604, a remote control receiving portion 2605, an image receiving portion 2606, a battery 2607, an audio input portion 2608, operation keys 2609, an eyepiece portion 2610, and the like. By using the semiconductor device of the present invention for the display portion 2602, a highly reliable video camera with high contrast and high visibility is obtained.

Figure 17C:
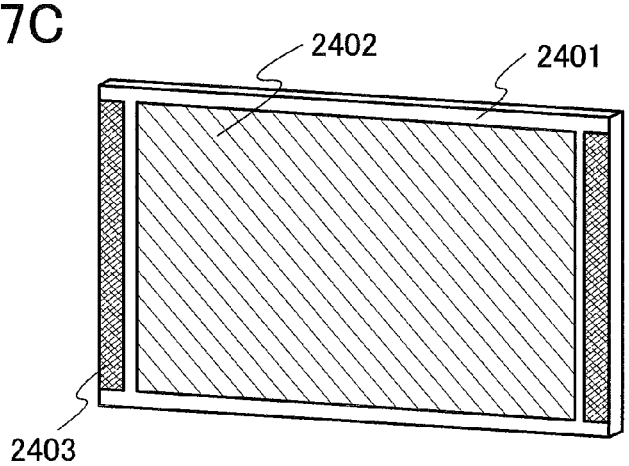

FIG. 17C shows an image display device which includes a housing 2401, a display portion 2402, a speaker portion 2403, and the like. By using the semiconductor device of the present invention for the display portion 2402, a highly reliable image display device with high contrast and high visibility is obtained. Note that the image display device corresponds to all image display devices for displaying images, such as those for personal computers, television broadcast reception, and advertisement display.

As described above, the present invention can be widely applied to and used in electronic devices in various fields.

This embodiment can be implemented by being combined with any of the above-described embodiment modes and embodiments, as appropriate.

This application is based on Japanese Patent Application serial no. 2007-311965 filed with Japan Patent Office on Dec. 3, 2007, the entire contents of which are hereby incorporated by reference.

What is claimed is:

1. A thin film transistor comprising:
a conductive film on an insulating surface;
a gate insulating film over the conductive film;
a first semiconductor film which overlaps with the conductive film over the gate insulating film; and
a pair of second semiconductor films over the first semiconductor film, wherein the pair of second semiconductor films comprises a first impurity element imparting one conductivity type,
wherein the first semiconductor film comprises a microcrystalline semiconductor,
wherein the first semiconductor film comprises a layer which is separated from the gate insulating film and the pair of second semiconductor films, and
wherein the layer comprises a second impurity element imparting a same conductivity type as the first impurity element.

2. The thin film transistor according to claim 1,
wherein an edge of part of the first semiconductor film is located beyond an edge of the pair of second semiconductor films.

3. The thin film transistor according to claim 1,
wherein regions of the first semiconductor film which overlap with the pair of second semiconductor films have a larger thickness than a region which does not overlap with the pair of second semiconductor films.

4. The thin film transistor according to claim 1,
wherein a peak concentration of the second impurity element in the layer comprising the second impurity element is higher than or equal to $1\times10^{17}$ atoms/cm$^3$ and lower than or equal to $1\times10^{19}$ atoms/cm$^3$.

5. The thin film transistor according to claim 1,
wherein the second impurity element is phosphorus (P), arsenic (As), antimony (Sb), sulfur (S), tellurium (Te), or selenium (Se).

6. A thin film transistor comprising:
a conductive film on an insulating surface;
a gate insulating film over the conductive film;
a first semiconductor film which overlaps with the conductive film over the gate insulating film; and
a pair of second semiconductor films over the first semiconductor film, wherein the pair of second semiconductor films comprises a first impurity element imparting one conductivity type,
wherein the first semiconductor film comprises at least a third semiconductor film comprising a microcrystalline semiconductor and a fourth semiconductor film comprising an amorphous semiconductor,
wherein the third semiconductor film comprises a layer which is separated from the gate insulating film,
wherein the layer comprises a second impurity element imparting a same conductivity type as the first impurity element, and
wherein the fourth semiconductor film is provided between the third semiconductor film and the pair of second semiconductor films.

7. The thin film transistor according to claim 6,
wherein the fourth semiconductor film comprises a microcrystalline semiconductor, and
wherein the third semiconductor film includes more microcrystalline semiconductor than the fourth semiconductor film.

8. The thin film transistor according to claim 6,
wherein an edge of part of the first semiconductor film is located beyond an edge of the pair of second semiconductor films.

9. The thin film transistor according to claim 6,
wherein regions of the first semiconductor film which overlap with the pair of second semiconductor films have a larger thickness than a region which does not overlap with the pair of second semiconductor films.

10. The thin film transistor according to claim 6,
wherein a peak concentration of the second impurity element in the layer comprising the second impurity element is higher than or equal to $1\times10^{17}$ atoms/cm$^3$ and lower than or equal to $1\times10^{19}$ atoms/cm$^3$.

11. The thin film transistor according to claim 6,
wherein the second impurity element is phosphorus (P), arsenic (As), antimony (Sb), sulfur (S), tellurium (Te), or selenium (Se).

12. A semiconductor device comprising:
a first conductive film on an insulating surface;
a gate insulating film over the first conductive film;
a first semiconductor film which overlaps with the first conductive film over the gate insulating film;
a pair of second semiconductor films over the first semiconductor film, wherein the pair of second semiconductor films comprises a first impurity element imparting one conductivity type; and
a pair of second conductive films over the pair of second semiconductor films, respectively,
wherein the first semiconductor film comprises a microcrystalline semiconductor,
wherein the first semiconductor film comprises a layer which is separated from the gate insulating film and the pair of second semiconductor films, and
wherein the layer comprises a second impurity element imparting a same conductivity type as the first impurity element.

13. The semiconductor device according to claim 12,
wherein regions of the first semiconductor film which overlap with the pair of second semiconductor films have a larger thickness than a region which does not overlap with the pair of second semiconductor films.

14. The semiconductor device according to claim 12,
wherein a peak concentration of the second impurity element in the layer comprising the second impurity element is higher than or equal to $1\times10^{17}$ atoms/cm$^3$ and lower than or equal to $1\times10^{19}$ atoms/cm$^3$.

15. The semiconductor device according to claim 12,
wherein the second impurity element is phosphorus (P), arsenic (As), antimony (Sb), sulfur (S), tellurium (Te), or selenium (Se).

16. An electronic device using the semiconductor device according to claim 12.

17. A semiconductor device comprising:
a first conductive film on an insulating surface;
a gate insulating film over the first conductive film;
a first semiconductor film which overlaps with the first conductive film over the gate insulating film;
a pair of second semiconductor films over the first semiconductor film, wherein the pair of second semiconductor films comprises a first impurity element imparting one conductivity type; and
a pair of second conductive films over the pair of second semiconductor films, respectively, wherein the first semiconductor film comprises at least a third semiconductor film comprising a microcrystalline semiconductor, and a fourth semiconductor film comprising an amorphous semiconductor,
wherein the third semiconductor film comprises a layer which is separated from the gate insulating film,
wherein the layer comprises a second impurity element imparting a same conductivity type as the first impurity element, and
wherein the fourth semiconductor film is provided between the third semiconductor film and the pair of second semiconductor films.

18. The semiconductor device according to claim 17,
wherein the fourth semiconductor film comprises a microcrystalline semiconductor, and
wherein the third semiconductor film includes more microcrystalline semiconductor than the fourth semiconductor film.

19. The semiconductor device according to claim 17,
wherein regions of the first semiconductor film which overlap with the pair of second semiconductor films have a larger thickness than a region which does not overlap with the pair of second semiconductor films.

20. The semiconductor device according to claim 17,
wherein a peak concentration of the second impurity element in the layer comprising the second impurity element is higher than or equal to $1\times10^{17}$ atoms/cm$^3$ and lower than or equal to $1\times10^{19}$ atoms/cm$^3$.

21. The semiconductor device according to claim 17,
wherein the second impurity element is phosphorus (P), arsenic (As), antimony (Sb), sulfur (S), tellurium (Te), or selenium (Se).

22. An electronic device using the semiconductor device according to claim 17.

* * * * *